ized Patent

(12) United States Patent
Lee et al.

(10) Patent No.: US 9,761,623 B2
(45) Date of Patent: Sep. 12, 2017

(54) BACKSIDE ILLUMINATED (BSI) IMAGE SENSOR WITH A REFLECTOR

(71) Applicant: Taiwan Semiconductor Manufacturing Co., Ltd., Hsin-Chu (TW)

(72) Inventors: Yueh-Chuan Lee, Hsinchu (TW); Chia-Chan Chen, Zhubei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/143,727

(22) Filed: May 2, 2016

(65) Prior Publication Data

US 2017/0236854 A1  Aug. 17, 2017

Related U.S. Application Data

(60) Provisional application No. 62/294,597, filed on Feb. 12, 2016.

(51) Int. Cl.
*H01L 31/0232* (2014.01)
*H01L 27/146* (2006.01)

(52) U.S. Cl.
CPC ...... *H01L 27/1464* (2013.01); *H01L 27/1463* (2013.01); *H01L 27/14629* (2013.01); *H01L 27/14636* (2013.01); *H01L 27/14643* (2013.01); *H01L 27/14685* (2013.01); *H01L 27/14689* (2013.01)

(58) Field of Classification Search
CPC .......... H01L 27/1464; H01L 27/14629; H01L 27/1463; H01L 27/14636
USPC ........................................................ 257/432
See application file for complete search history.

(56) References Cited

U.S. PATENT DOCUMENTS

2009/0200586 A1* 8/2009 Mao .................. H01L 27/14625
257/292

* cited by examiner

*Primary Examiner* — Theresa T Doan
(74) *Attorney, Agent, or Firm* — Eschweiler & Potashnik, LLC

(57) ABSTRACT

A backside illuminated (BSI) image sensor with a reflector is provided. A pixel sensor is arranged on a lower side of a semiconductor substrate, and comprises a photodetector arranged within the semiconductor substrate. An interconnect structure is arranged under the semiconductor substrate and the pixel sensor, and comprises an interconnect layer and a contact via extending from the interconnect layer to the pixel sensor. The reflector is arranged under the photodetector, between the interconnect layer and the photodetector, and is configured to reflect incident radiation towards the photodetector. A method for manufacturing the BSI image sensor is also provided.

20 Claims, 21 Drawing Sheets

BACKSIDE ILLUMINATED (BSI) IMAGE SENSOR WITH A REFLECTOR

REFERENCE TO RELATED APPLICATION

This application claims the benefit of U.S. Provisional Application No. 62/294,597, filed on Feb. 12, 2016, the contents of which are incorporated by reference in their entirety.

BACKGROUND

Many modern day electronic devices comprise image sensors that convert optical images to digital data representing the optical images. One type of image sensor commonly used in electronic devices is a backside illumination (BSI) image sensor. A BSI image sensor comprises an array of photodetectors overlying an interconnect structure and configured to receive radiation on an opposite side as the interconnect structure. This arrangement allows radiation to impinge on the photodetectors unobstructed by conductive features in the interconnect structure, such that the BSI image sensor has high sensitivity to incident radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
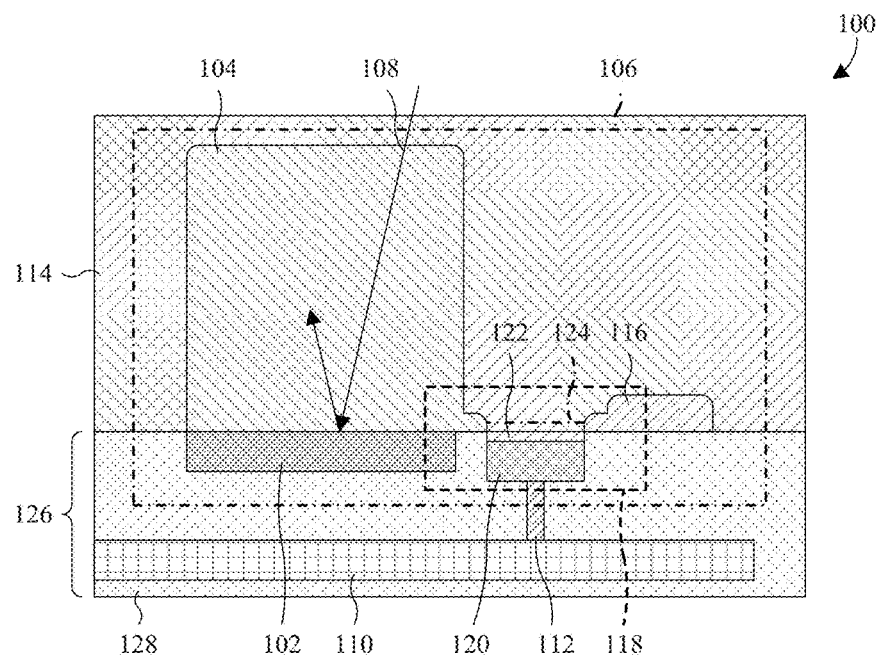
FIG. 1 illustrates a cross-sectional view of some embodiments of a backside illuminated (BSI) image sensor with a reflector.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some backside illuminated (BSI) image sensors comprise an array of photodetectors arranged within a semiconductor substrate that overlies an interconnect structure. The photodetectors extend away from the interconnect structure, deep into the semiconductor substrate, from proximate the interconnect structure, and are configured to receive radiation (e.g., light) on an opposite side as the interconnect structure.

To increase sensitivities of the photodetectors to radiation, the photodetectors may extend deeper into the semiconductor substrate, thereby increasing the area for absorbing the radiation. However, increasing the depth to which the photodetectors extend increases manufacturing costs. Further, to increase the sensitivities of the photodetectors to radiation, conductive features of the interconnect structure may be employed to reflect radiation back towards the photodetectors, thereby providing the photodetectors with two opportunities to absorb the radiation. However, the conductive features are spaced from the photodetectors by at least an interlayer dielectric (ILD) layer of the interconnect structure, such that the radiation is likely to diverge to neighboring pixel sensors and induce crosstalk.

The present application is directed towards a BSI image sensor with a reflector for high sensitivity and low crosstalk. In some embodiments, a pixel sensor is arranged on a lower side of a semiconductor substrate, and comprises a photodetector arranged within the semiconductor substrate. An interconnect structure is arranged under the semiconductor substrate, and comprises a contact via extending from an interconnect layer of the interconnect structure to the pixel sensor. A reflector is arranged under the photodetector, between the interconnect layer and the photodetector, and is configured to reflect radiation that passes through the photodetector back towards the photodetector.

By arranging the reflector under the photodetector, the photodetector advantageously has two opportunities to absorb radiation impinging on the photodetector. The first opportunity occurs when the radiation initially impinges on the photodetector, and the second opportunity occurs when the radiation is reflected back to the photodetector. As such, the photodetector has high sensitivity to incident radiation. Further, by arranging the reflector between the interconnect layer and the photodetector, the reflector is in close proximity to the photodetector and crosstalk is advantageously minimal.

With reference to FIG. 1, a cross-sectional view 100 of some embodiments of a BSI image sensor with a reflector 102 is provided. As illustrated, the reflector 102 is arranged under a photodetector 104 of a pixel sensor 106 and is configured to reflect radiation 108 passing through the photodetector 104 back to the photodetector 104. By reflecting the radiation 108 back to the photodetector 104, the photodetector 104 has high sensitivity. The reflector 102 is further arranged over an interconnect layer 110 that is electrically coupled to the pixel sensor 106 by a contact via 112 extending therebetween. By arranging the reflector 102 over the interconnect layer 110, between the interconnect layer 110 and the photodetector 104, the reflector 102 is in close proximity to the photodetector 104 and crosstalk between the pixel sensor 106 and a neighboring pixel sensor (not shown) is minimal.

The pixel sensor 106 is arranged on a lower side of a semiconductor substrate 114, and comprises the photodetector 104. The photodetector 104 is configured to absorb radiation 108 impinging thereon and, in some embodiments, contacts the reflector 102. Further, the photodetector 104 is arranged in the semiconductor substrate 114, and is or otherwise includes a doped semiconductor region of opposite doping type as a surrounding region of the semiconductor substrate 114. In some embodiments, the pixel sensor 106 further comprises a floating diffusion node (FDN) 116 and a transfer transistor 118. The FDN 116 is configured to store charge transferred thereto from the photodetector 104, and the transfer transistor 118 is configured to selectively transfer the charge to the FDN 116. The FDN 116 is arranged in the semiconductor substrate 114, and is or otherwise includes a doped semiconductor region of opposite doping type as a surrounding region of the semiconductor substrate 114. The transfer transistor 118 comprises a gate 120 arranged on the semiconductor substrate 114, laterally adjacent to the photodetector 104, and spaced from the semiconductor substrate 114 by a gate dielectric layer 122. Further, the transfer transistor 118 comprises source/drain regions arranged in the semiconductor substrate 114, respectively on opposing sides of the gate 120, to define a channel region 124 over the gate 120. In some embodiments, one of the source/drain regions is the photodetector 104, and/or one of the source/drain regions is the FDN 116.

An interconnect structure 126 underlies the pixel sensor 106 and the semiconductor substrate 114, and covers a lower side of the pixel sensor 106 and the lower side of the semiconductor substrate 114. The interconnect structure 126 comprises the interconnect layer 110 and the contact via 112, as well as an ILD region 128. The interconnect layer 110 is defined by one or more conductive features (not shown), and the contact via 112 extends from one of the conductive feature(s) to the pixel sensor 106. In some embodiments, the contact via 112 extends to the gate 120 of the transfer transistor 118. The ILD region 128 houses and insulates the interconnect layer 110, the contact via 112, and, in some embodiments, the reflector 102.

With reference to FIGS. 2A-2D, cross-sectional views 200A-200D of various embodiments of the reflector 102 of FIG. 1 are provided. As illustrated by the cross-sectional view 200A of FIG. 2A, the reflector 102 comprises a first segment 202 and a second segment 204 arranged along a photodetector 104. The reflector 102 is discontinuous between the first and second segments 202, 204 and, in some embodiments, the first and second segments 202, 204 are different materials. In other embodiments, the first and second segments 202, 204 are the same material. The first and second segments 202, 204 may be, for example, copper, titanium, chromium, niobium, lead, palladium, gold, silver, aluminum, aluminum copper, tungsten, or some other reflective material.

The first segment 202 is arranged under the photodetector 104 and over an interconnect layer 110. In some embodiments, the first segment 202 contacts the photodetector 104. Further, the first segment 202 extends laterally from a first side of the photodetector 104, towards a second side of the photodetector 104 that opposes the first side. In some embodiments, the first segment 202 extends laterally with a uniform thickness T, and/or with an upper or top surface 206 that is planar and that faces the photodetector 104. An isolation region 208 is arranged on the first side of the photodetector 104 and, in some embodiments, a transfer transistor 118 is arranged on the second side of the photodetector 104. The isolation region 208 extends into a lower side of the semiconductor substrate 114, away from the first segment 202.

The second segment 204 is arranged over the first segment 202, within the isolation region 208. In some embodiments, the second segment 204 contacts the first segment 202 and/or is confined to the isolation region 208. Further, the second segment 204 extends into the isolation region 208, away from the first segment 202. In some embodiments, the second segment 204 extends into the isolation region 208 with a uniform width W, and/or with a sidewall surface 210 that is planar and that faces the photodetector 104.

By arranging the first and second segments 202, 204 along the photodetector 104, radiation 108 passing through the photodetector 104 may be reflected back to the photodetector 104. Further, by arranging the second segment 204 laterally adjacent to the photodetector 104, the radiation 108 may be prevented from reflecting towards a neighboring pixel sensor (not shown). For example, the radiation 108 may reflect off the first segment 202 towards the neighboring pixel sensor (not shown) and the second segment 204, and then reflect off the second segment 204 back towards the photodetector 104. Therefore, the photodetector 104 has high sensitivity and crosstalk is minimal.

Figure 2A:
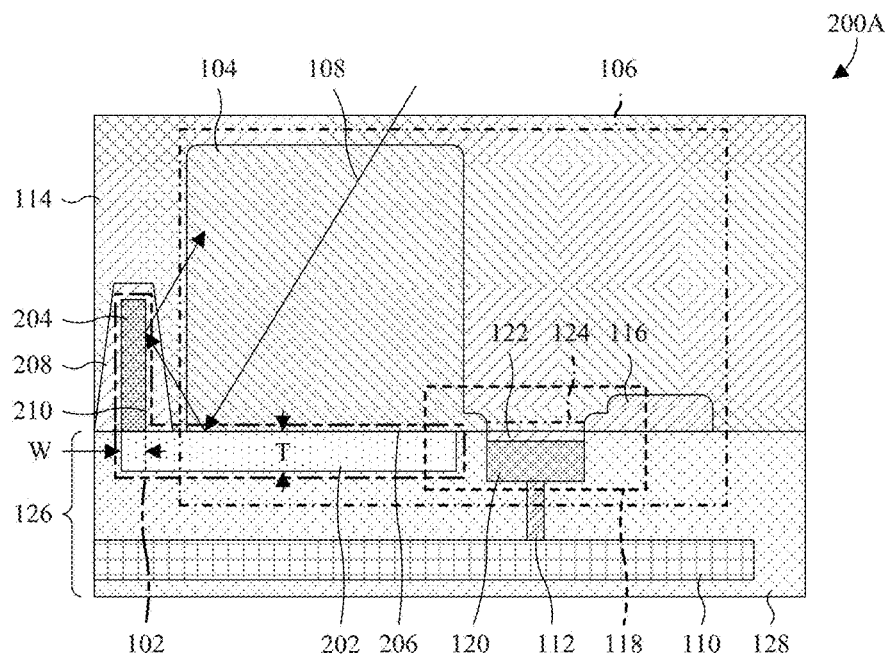
FIGS. 2A-2D illustrate cross-sectional views of various embodiments of the reflector of FIG. 1.
Figure 2B:
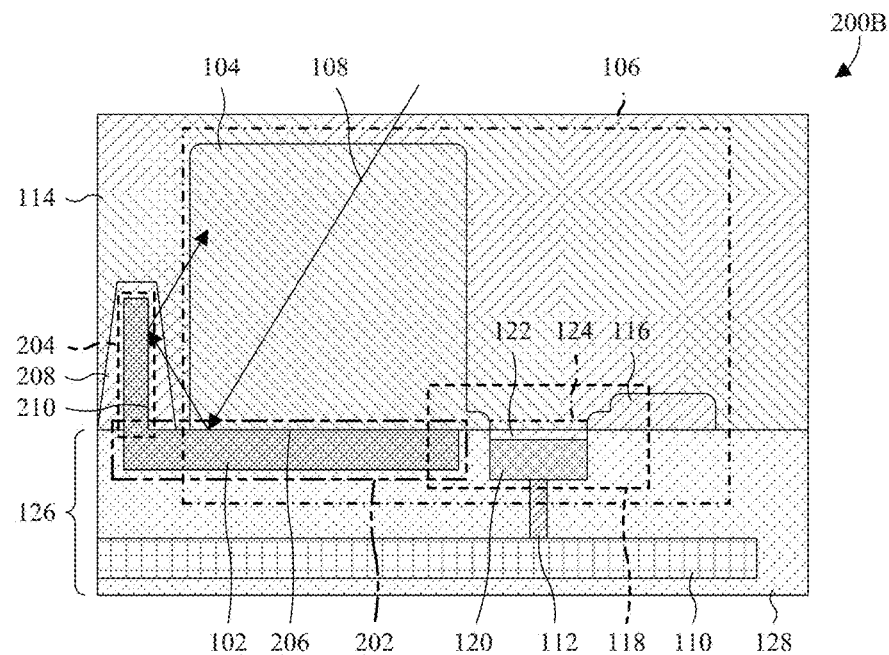

As illustrated by the cross-sectional view 200B of FIG. 2B, the reflector 102 includes the first and second segments 202, 204 and extends continuously between the first and second segments 202, 204. Further, the first and second segments 202, 204 are the same material. For example, the first and second segments 202, 204 may be, for example, copper, titanium, chromium, niobium, lead, palladium, gold, silver, aluminum, aluminum copper, tungsten, or some other reflective material.

Figure 2C:
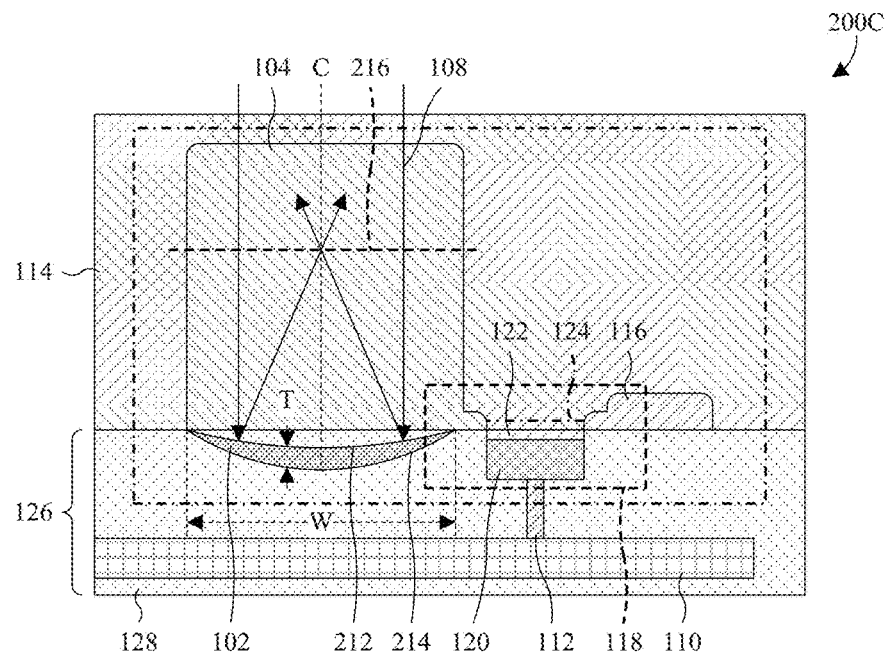

As illustrated by the cross-sectional view 200C of FIG. 2C, the reflector 102 has an upper or top surface 212 that is concave and a lower or bottom surface 214 that is convex. The upper or top surface 212 and the lower or bottom surface 214 extend laterally between opposing sides of a photodetector 104 and, in some embodiments, have the same footprint. The footprint is a two-dimensional projection of the upper or top surface 212 or the lower or bottom surface 214 onto a horizontal plane. In some embodiments, the reflector 102 is symmetrical about a central axis C that is orthogonal to the upper or top surface 212 and that is arranged at a midpoint of a width W of the reflector 102. Further, in some embodiments, a thickness T of the reflector 102 increases from zero or a predetermined value while moving laterally from an edge of the reflector 102 to the midpoint.

By arranging the reflector 102 under the photodetector 104, radiation 108 passing through the photodetector 104 may be reflected back to the photodetector 104. As such, the photodetector 104 has high sensitivity. Further, by configuring the upper or top surface 212 of the reflector 102 with a concave profile, the radiation 108 is focused to a focal plane 216 extending laterally through the photodetector 104. For example, light rays of the radiation 108 that impinge on the upper or top surface 212 of the reflector 102 in parallel may be reflected to a common focal point on the focal plane 216. As such, crosstalk is minimal.

Figure 2D:
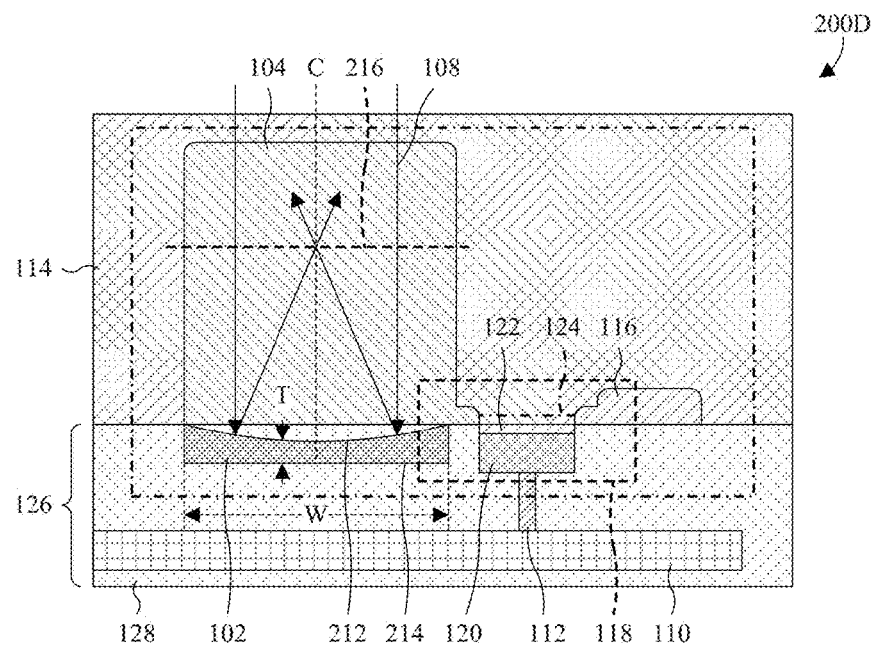

As illustrated by the cross-sectional view 200D of FIG. 2D, the upper or top surface 212 of the reflector 102 is concave and the lower or bottom surface 214 of the reflector 102 is planar. Further, a thickness T of the reflector 102 decreases while moving laterally from an edge of the reflector 102 to a midpoint of the width W of the reflector 102.

Figure 3:
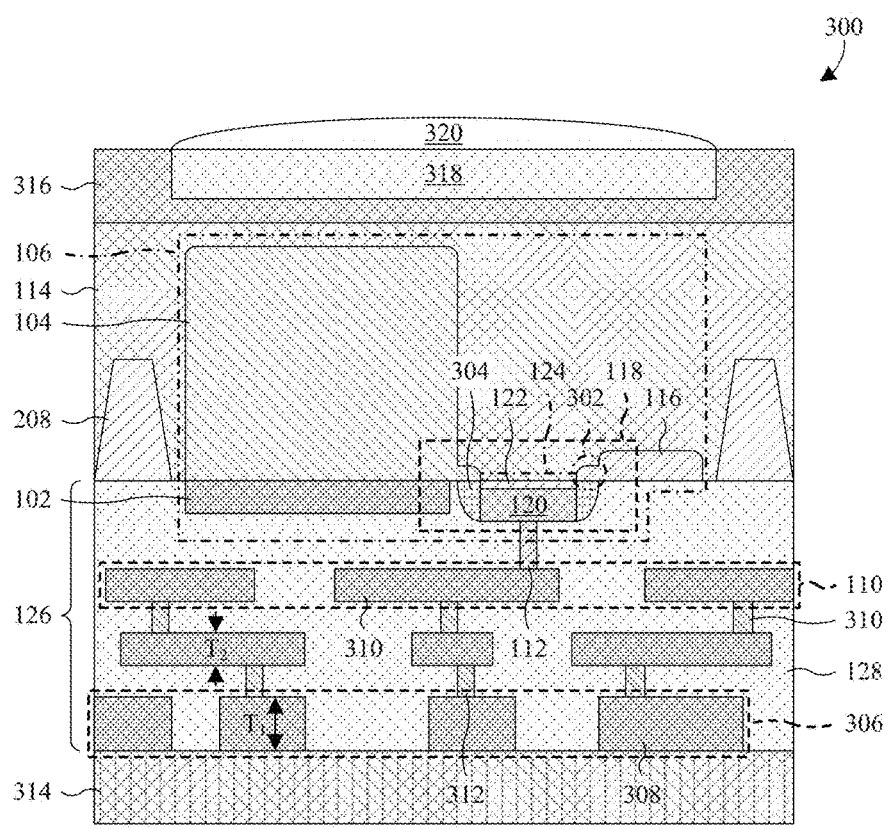
FIG. 3 illustrates a cross-sectional view of some more detailed embodiments of the BSI image sensor of FIG. 1.

With reference to FIG. 3, a cross-sectional view 300 of some more detailed embodiments of the BSI image sensor of FIG. 1 is provided. As illustrated, a semiconductor substrate 114 accommodates an isolation region 208 and a pixel sensor 106 on a lower side of the semiconductor substrate 114. The semiconductor substrate 114 may be, for example, a bulk substrate of silicon or some other semiconductor. The isolation region 208 is configured to electrically and/or to optically isolate the pixel sensor 106 from a neighboring pixel sensor (not shown), and extends into the semiconductor substrate 114. Further, the isolation region 208 is arranged on opposing sides of the pixel sensor 106 and, in some embodiments, laterally surrounds the pixel sensor 106. The isolation region 208 may be, for example, a shallow trench isolation (STI) region, an implant isolation region, or a deep trench isolation (DTI) region. The pixel sensor 106 is configured to sense incident radiation and comprises a photodetector 104. Further, in some embodiments, the pixel sensor 106 comprises a FDN 116 and a transfer transistor 118. The pixel sensor 106 may be, for example, an active pixel sensor (APS).

The photodetector 104 and the FDN 116 are arranged in the semiconductor substrate 114, and are doped semiconductor regions of opposite doping type (n-type or p-type) as respective regions of the semiconductor substrate 114 that surround the doped semiconductor regions. The photodetector 104 is configured to generate and store charge in response to incident radiation, and the FDN 116 is configured to store charge transferred thereto from the photodetector 104. In some embodiments, the photodetector 104 and/or the FDN 116 have lateral extensions 302 of reduced depth and/or concentration as respective bulks of the photodetector 104 and/or the FDN 116.

The transfer transistor 118 is configured to transfer charge accumulated in the photodetector 104 to the FDN 116. The transfer transistor 118 comprises a gate 120 arranged on the semiconductor substrate 114, laterally adjacent to the photodetector 104. The gate 120 is spaced from the semiconductor substrate 114 by a gate dielectric layer 122 and, in some embodiments, has sidewall surfaces lined by a sidewall spacer 304. The gate 120 may be, for example, metal, doped polysilicon, or some other conductive material. The gate dielectric layer 122 may be, for example, silicon dioxide, a high κ dielectric (i.e., a dielectric with a dielectric constant κ exceeding about 3.9), or some other dielectric material. The sidewall spacer 304 may be, for example, silicon nitride, silicon oxynitride, or some other dielectric material. The transfer transistor 118 further comprises source/drain regions arranged in the semiconductor substrate 114, respectively on opposing sides of the gate 120, to define a channel region 124 over the gate 120 that selectively conducts depending upon a bias applied to the gate 120. The source/drain regions are doped semiconductor regions of opposite doping type as respective regions of the semiconductor substrate 114 that surround the doped semiconductor regions. In some embodiments, one of the source/drain regions is the photodetector 104, and/or one of the source/drain regions is the FDN 116.

An interconnect structure 126 underlies the semiconductor substrate 114 and the pixel sensor 106, and covers a lower side of the pixel sensor 106 and a lower side of the semiconductor substrate 114. The interconnect structure 126 comprises an ILD region 128 and a plurality of interconnect layers 110, 306 (e.g., metallization layers) stacked within the ILD region 128. In some embodiments, the ILD region 128 may be, for example, silicon dioxide, a low κ dielectric (i.e., a dielectric with a dielectric constant κ less than about 3.9), phosphosilicate glass (PSG), some other dielectric, or a combination of the foregoing. For example, the ILD region 128 may comprise a silicon dioxide or PSG layer and a plurality of low κ dielectric layers stacked below the silicon dioxide or PSG layer.

The interconnect layers 110, 306 are defined by respective conductive features 308, 310, such as, for example, lines or pads. Further, in some embodiments, an interconnect layer 306 farthest from the semiconductor substrate has a greater thickness $T_1$ than a shared thickness $T_2$ of the other interconnect layers 110. The interconnect layers 110, 306 are electrically coupled to one another by interconnect vias 312 extending between neighboring interconnect layers. Further, an interconnect layer 110 closest to the semiconductor substrate 114 is electrically coupled to the pixel sensor 106 by one or more contact vias 112 extending from the interconnect layer 110 to the pixel sensor 106. For example, a contact via 112 may extend from the interconnect layer 110 to the gate 120 of the transfer transistor 118. The interconnect layers 110, 306, the contact via(s) 112, and the interconnect vias 312 may be, for example, a metal, such as copper, titanium, chromium, niobium, lead, palladium, gold, silver, aluminum, tungsten, or some other conductive material.

A reflector 102 is arranged under the photodetector 104 and is configured to reflect radiation that passes through the photodetector 104 back towards the photodetector 104. By reflecting the radiation back towards the photodetector 104, the photodetector 104 has high sensitivity. The reflector 102 is further arranged over the interconnect layer 110 closest to the semiconductor substrate 114. By arranging the reflector 102 over the interconnect layer 110 closest to the semiconductor substrate 114, the reflector 102 is in close proximity to the photodetector 104. Further, the likelihood of the radiation reflecting to a neighboring pixel sensor (not shown) is low and crosstalk is minimal. In some embodiments, the reflector 102 directly abuts the photodetector 104, and/or the reflector 102 is configured according to one of the embodiments of FIGS. 2A-2D. Further, in some embodiments, the reflector 102 is copper, titanium, chromium, niobium, lead, palladium, gold, silver, aluminum, tungsten, some other conductive material, or a combination of the foregoing.

In some embodiments, a support device 314 is arranged under and affixed to the semiconductor substrate 114 through the interconnect structure 126. The support device 314 may be, for example, a bulk substrate or an IC chip. In some embodiments, the IC chip is electrically coupled to the pixel sensor 106 through the interconnect structure 126. The IC chip may, for example, comprise an additional semiconductor substrate (not shown) and an additional interconnect structure (not shown) arranged over the additional semiconductor substrate.

A passivation layer 316 is arranged over the semiconductor substrate 114 and the pixel sensor 106 on an opposite side of the semiconductor substrate 114 as the interconnect structure 126. The passivation layer 316 comprises a well filled with a color filter 318 and covered by a microlens 320.

The passivation layer 316 may be, for example, a multilayer stack of dielectric layers, such as, for example, a nitride layer stacked between a pair of oxide layers. The color filter 318 is configured to selectively transmit an assigned color or wavelengths of radiation to the pixel sensor 106, and the microlens 320 is configured to focus incident radiation onto the color filter 318 and/or the pixel sensor 106.

Figure 4:
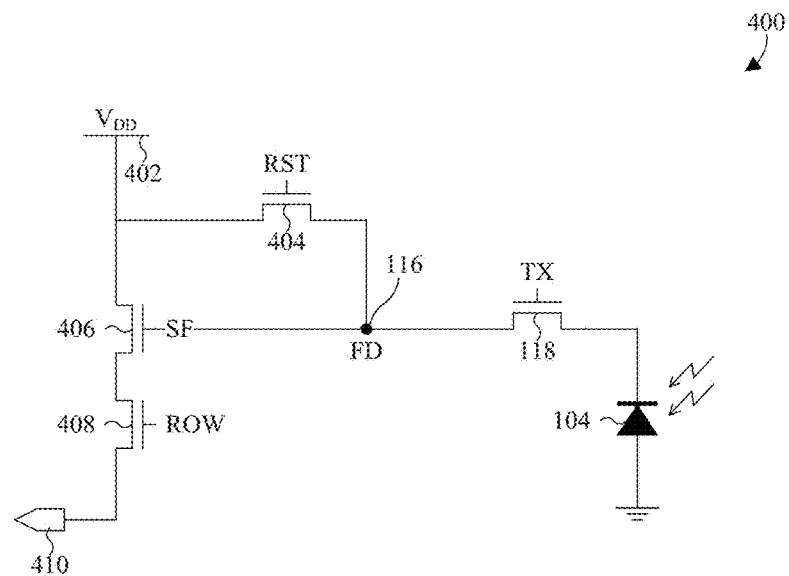
FIG. 4 illustrates a circuit diagram of some embodiments of a pixel sensor in the BSI image sensor of FIG. 1.

With reference to FIG. 4, a circuit diagram 400 of some embodiments of the pixel sensor 106 in the BSI image sensor of FIG. 1 is provided. As illustrated, a FDN 116 is selectively coupled to a photodetector 104 by a transfer transistor 118, and is selectively coupled to a power source 402 by a reset transistor 404. The photodetector 104 may be, for example, a photodiode, and/or the power source 402 may be, for example, a direct current (DC) power source. The transfer transistor 118 is configured to transfer charge accumulated in the photodetector 104 to the FDN 116, and the reset transistor 404 is configured to clear charge stored at the FDN 116. The FDN 116 gates a source follower transistor 406 that selectively couples the power source 402 to a row select transistor 408, and the row select transistor 408 selectively couples the source follower transistor 406 to an output 410. The source follow transistor 406 is configured to non-destructively read and amplify charge stored in the FDN 116, and the row select transistor 408 is configured to select the pixel sensor 106 for readout.

While the pixel sensor 106 in the BSI image sensor of FIG. 1 is described as a five transistor (5T) APS within FIG. 4, it is to be appreciated that other embodiments of the pixel sensor 106 may include more or less transistors. For example, other embodiments of the pixel sensor 106 may include two, three, or six transistors.

Figure 5:
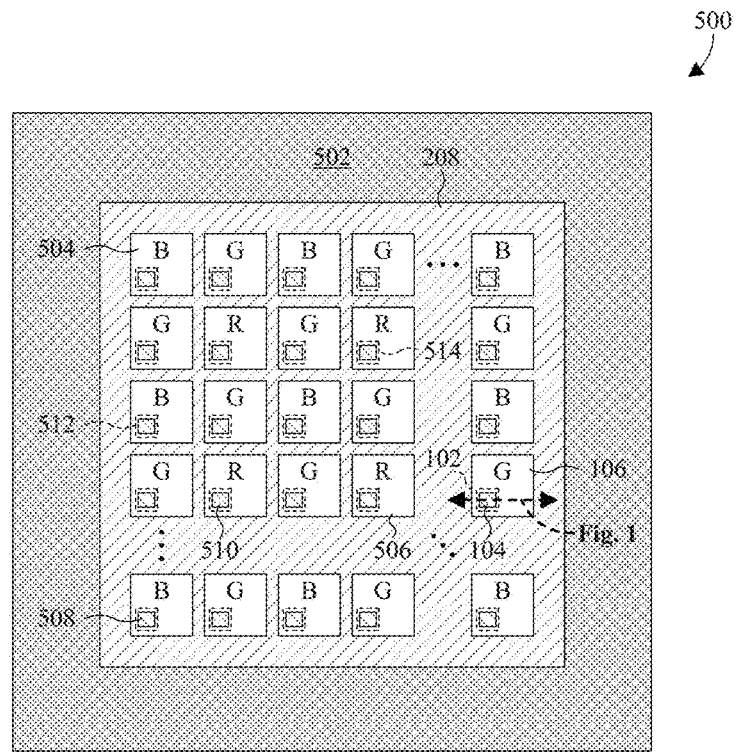
FIG. 5 illustrates a top view of some embodiments of the BSI image sensor of FIG. 1.

With reference to FIG. 5, a top view 500 of some embodiments of the BSI image sensor of FIG. 1 is provided. As illustrated, a logic region 502 of the BSI image sensor laterally surrounds an isolation region 208 within which an array of pixel sensors 106, 504, 506 are arranged. The logic region 502 comprises, for example, logic and/or memory devices (not shown) configured to read and/or store data generated by the pixel sensors 106, 504, 506 in response to incident radiation. The isolation region 208 is configured to isolate the pixel sensors 106, 504, 506 and is, for example, an STI region.

The pixel sensors 106, 504, 506 are assigned respective wavelengths of radiation. In some embodiments, the pixel sensors 106, 504, 506 are alternatingly assigned red wavelengths of radiation (e.g., about 620 to about 750 nanometers), green wavelengths of radiation (e.g., about 495 to about 570 nanometers), and blue wavelengths of radiation (e.g., about 450 to about 495 nanometers). For example, pixel sensors 506 labeled "R" are assigned red wavelengths of radiation, pixel sensors 504 labeled "B" are assigned blue wavelengths of radiation, and pixel sensors 106 labeled "G" are assigned green wavelengths of radiation. Further, in some embodiments, the pixel sensors 106, 504, 506 alternate between red, green, and blue wavelength assignments according to a Bayer filter mosaic.

The pixel sensors 106, 504, 506 are individually configured according to the pixel sensor 106 in FIG. 1, 2A-2D, or 3, and comprise individual color filters (not shown) configured to filter incident radiation according to the assigned wavelengths of radiation. For example, as seen in FIG. 3, a pixel sensor 106 comprises a color filter 318 arranged thereover. Further, the pixel sensors 106, 504, 506 comprise individual photodetectors 104, 508, 510 and individual reflectors 102, 512, 514 (shown in phantom) underlying the photodetectors 104, 508, 510.

In some embodiments, the reflectors 102, 512, 514 are different materials depending upon the assigned wavelengths of radiation for respective pixel sensors 106, 504, 506. The materials of the reflectors 102, 512, 514 may, for example, be selected to optimize reflectance of the assigned wavelengths of radiation. For example, reflectors 102 assigned green wavelengths of radiation may be a first material with a high reflectance for the green wavelengths (relative to blue and red wavelengths), reflectors 512 assigned blue wavelengths of radiation may be a second material with a high reflectance for the blue wavelengths (relative to green and red wavelengths), and reflectors 514 assigned red wavelengths of radiation may be a third material with a high reflectance for the red wavelengths (relative to green and blue wavelengths).

Further, in some embodiments, the reflectors 102, 512, 514 are laterally offset from respective ones of the photodetectors 104, 508, 510 in proportion to a distance from a center of the array and/or in a direction away from the center of the array. The lateral offsets may be, for example, with respect to edges and/or centers of the photodetectors 104, 508, 510 and the reflectors 102, 512, 514. In some embodiments, the centers of the photodetectors 104, 508, 510, the reflectors 102, 512, 514, and the array are centroids of respective footprints. A footprint is a two-dimensional projection onto a horizontal plane.

With reference to FIGS. 6-9, 10A-10D, 11A, 11B, 12-16, 17A-17D, 18A, 18B, and 19-27, a series of cross-sectional views of various embodiments of a method for manufacturing a BSI image sensor with a reflector 102 (see, e.g., FIG. 10C, 11A, 17C, 18A, or 22) is provided.

Figure 6:
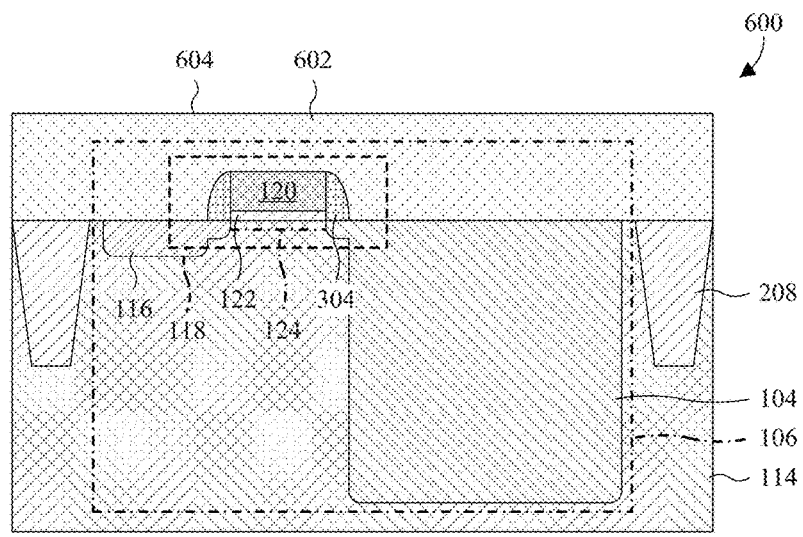
FIGS. 6-9, 10A-10D, 11A, 11B, 12-16, 17A-17D, 18A, 18B, and 19-27 illustrate a series of cross-sectional views of various embodiments of a method for manufacturing a BSI image sensor with a reflector.

As illustrated by the cross-sectional view 600 of FIG. 6, a first ILD layer 602 is formed covering an isolation region 208, a pixel sensor 106, and a semiconductor substrate 114. Further, in some embodiments, the first ILD layer 602 is formed with an upper or top surface 604 that is planar, and/or is formed of silicon dioxide, PSG, or a low κ dielectric. The isolation region 208 extends into the semiconductor substrate 114 and is arranged on opposing sides of the pixel sensor 106. The pixel sensor 106 comprises a photodetector 104 and, in some embodiments, a FDN 116 and a transfer transistor 118. The photodetector 104 and the FDN 116 are arranged in the semiconductor substrate 114. The transfer transistor 118 comprises a gate 120 arranged on the semiconductor substrate 114, and spaced from the semiconductor substrate 114 by a gate dielectric layer 122. Further, the transfer transistor 118 comprises source/drain regions arranged respectively on opposing sides of the gate 120 to define a channel region 124 under the gate 120. The source/drain regions may be, for example, the photodetector 104 and the FDN 116. Even more, in some embodiments, the transfer transistor 118 comprises a sidewall spacer 304 lining sidewall surfaces of the gate 120.

In some embodiments, the process for forming the first ILD layer 602 comprises depositing or otherwise growing the first ILD layer 602 over the isolation region 208, the pixel sensor 106, and the semiconductor substrate 114. For example, the first ILD layer 602 may be deposited by vapor deposition, such as chemical vapor deposition (CVD) or physical vapor deposition (PVD), or grown by thermal oxidation. Thereafter, a planarization is performed into the upper or top surface 604 of the first ILD layer 602. The planarization may be performed by, for example, a chemical mechanical polish (CMP).

With reference to FIGS. 7-9 and 10A-10D, a series of cross-sectional views 700-900, 1000A-1000D of first embodiments of a method for manufacturing the reflector 102 (see, e.g., FIG. 10C) is provided. The first embodiments may, for example, correspond to FIG. 2A.

Figure 7:
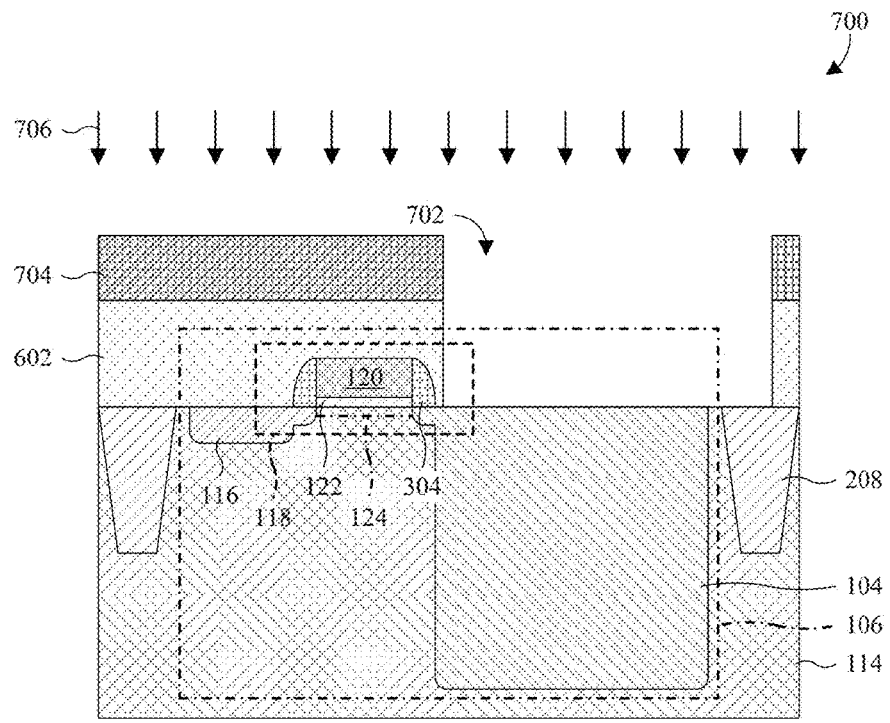

As illustrated by the cross-sectional view 700 of FIG. 7, a first etch is performed into the first ILD layer 602 to form a first opening 702. The first opening 702 is formed to expose the semiconductor substrate 114, and to expose the isolation region 208 at a location laterally adjacent to the photodetector 104. Further, the first opening 702 is formed to define a reflector region within which the reflector 102 (see, e.g., FIG. 10C) is formed and, in some embodiments, is formed laterally adjacent to the transfer transistor 124. Even more, in some embodiments, the process for performing the first etch comprises depositing and patterning a first photoresist layer 704 over the first ILD layer 602. Thereafter, a first etchant 706 is applied to the first ILD layer 602, while using the first photoresist layer 704 as a mask, to form the first opening 702. After forming the first opening 702, the first photoresist layer 704 is removed.

Figure 8:
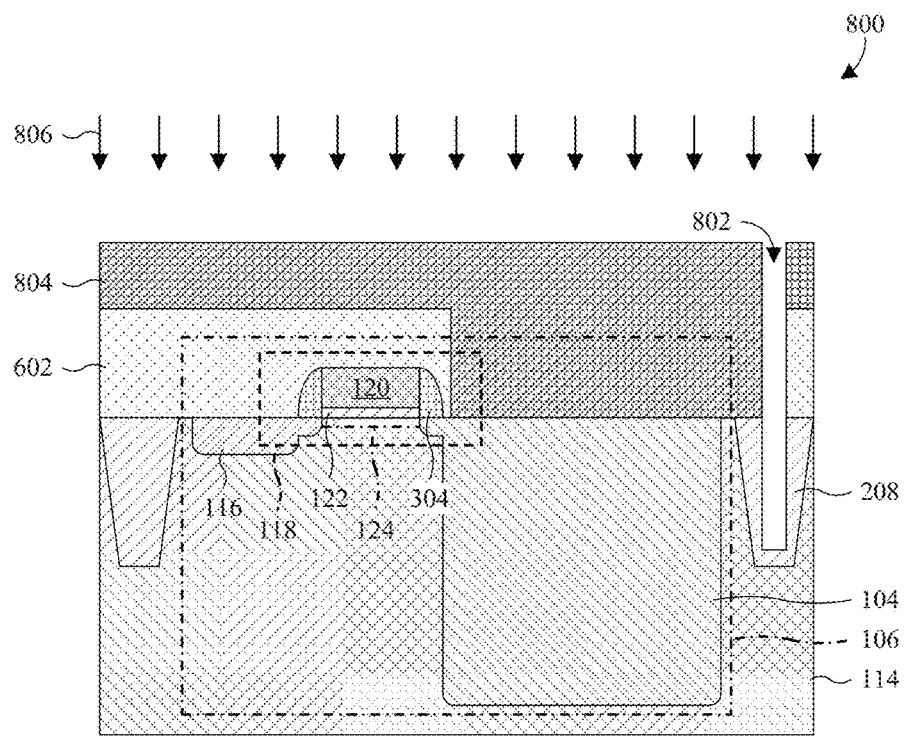

As illustrated by the cross-sectional view 800 of FIG. 8, a second etch is performed into the isolation region 208, through the first opening 702 (see, e.g., FIG. 7), to form a second opening 802 in the isolation region 208. In some embodiments, the second opening 802 is formed confined to the isolation region 208, such that sidewall surfaces of the second opening 802 and a lower or bottom surface of the second opening 802 are spaced and insulated from a bulk of the semiconductor substrate 114. Further, in some embodiments, the process for performing the second etch comprises depositing and patterning a second photoresist layer 804 over the first ILD layer 602 and partially filling the first opening 702, such that the isolation region 208 is partially exposed. Thereafter, a second etchant 806 is applied to the isolation region 208, while using the second photoresist layer 804 as a mask, to form the second opening 802. After forming the second opening 802, the second photoresist layer 804 is removed.

Figure 9:
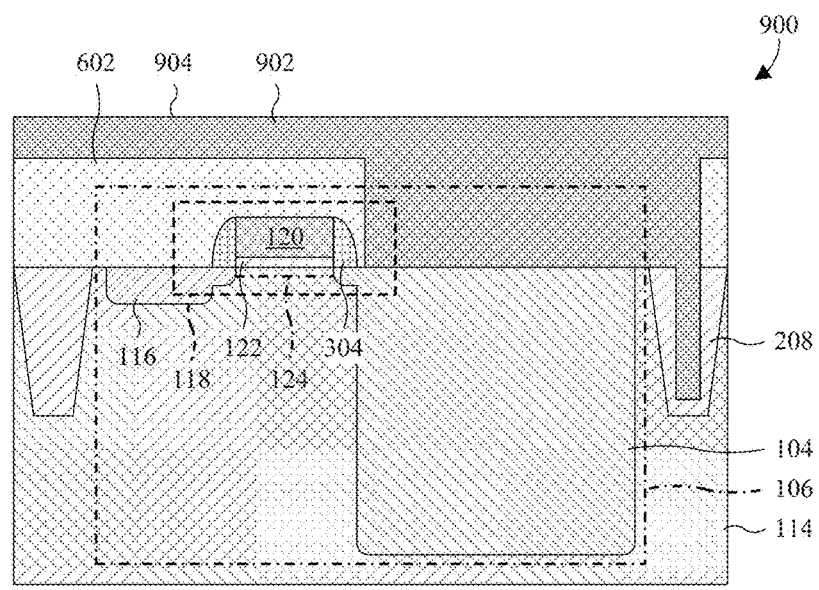

As illustrated by the cross-sectional view 900 of FIG. 9, a first reflective layer 902 is formed covering the first ILD layer 602 and filling the first and second openings 702, 802 (see, e.g., FIGS. 7 and 8). Further, in some embodiments, the first reflective layer 902 is formed with an upper or top surface 904 that is planar, and/or is formed of aluminum, silver, gold, aluminum copper, copper, or some other metal. Even more, in some embodiments, the process for forming the first reflective layer 902 comprises depositing or otherwise growing the first reflective layer 902 covering the first ILD layer 602 and filling the first and second openings 702, 802. Thereafter, a planarization is performed into the upper or top surface 904 of the first reflective layer 902 to planarize the upper or top surface 904 of the first reflective layer 902.

Figure 10A:
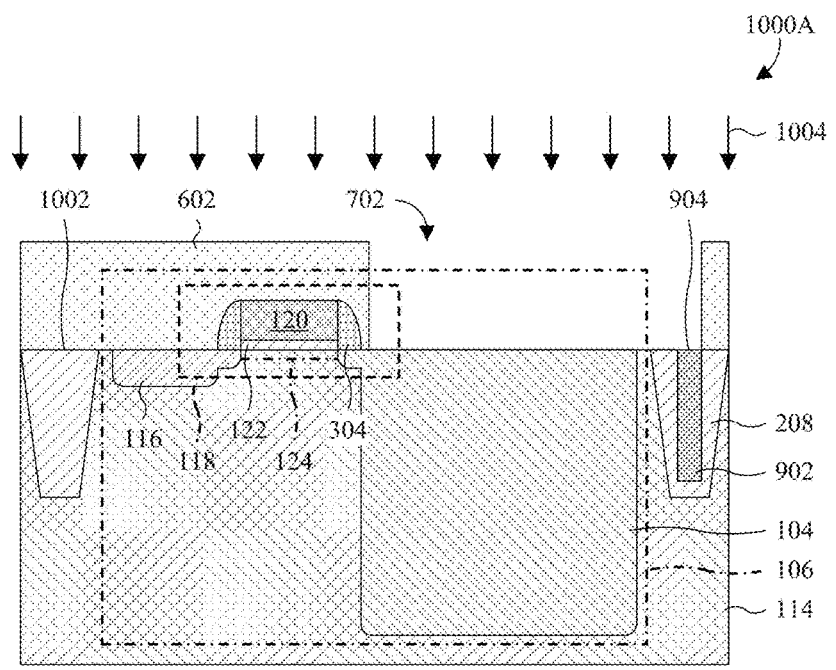

As illustrated by the cross-sectional view 1000A of FIG. 10A, a third etch is performed into the first reflective layer 902 to etch back the first reflective layer 902 until the upper or top surface 904 of the first reflective layer 902 is about even with an upper or top surface 1002 of the isolation region 208. In some embodiments, the process for performing the third etch comprises applying a third etchant 1004 to the first reflective layer 902 until the upper or top surface 904 of the first reflective layer 902 is about even with the upper or top surface 1002 of the isolation region 208. The third etchant 1004 may, for example, be preferential (i.e., more selective) of the first reflective layer 902 relative to the first ILD layer 602.

Figure 10B:
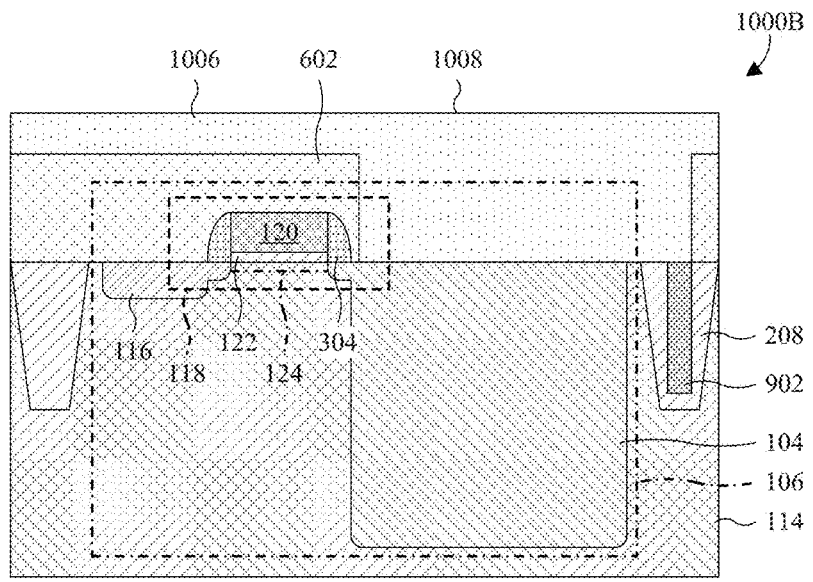

As illustrated by the cross-sectional view 1000B of FIG. 10B, a second reflective layer 1006 is formed covering the first ILD layer 602 and filling the first opening 702 (see, e.g., FIG. 10A). Further, in some embodiments, the second reflective layer 1006 is formed with an upper or top surface 1008 that is planar, and/or is formed of aluminum, silver, gold, aluminum copper, copper, or some other metal. Even more, in some embodiments, the process for forming the second reflective layer 1006 comprises depositing or otherwise growing the second reflective layer 1006 covering the first ILD layer 602 and filling the first opening 702. Thereafter, a planarization is performed into the upper or top surface 1008 of the second reflective layer 1006 to planarize the upper or top surface 1008.

Figure 10C:
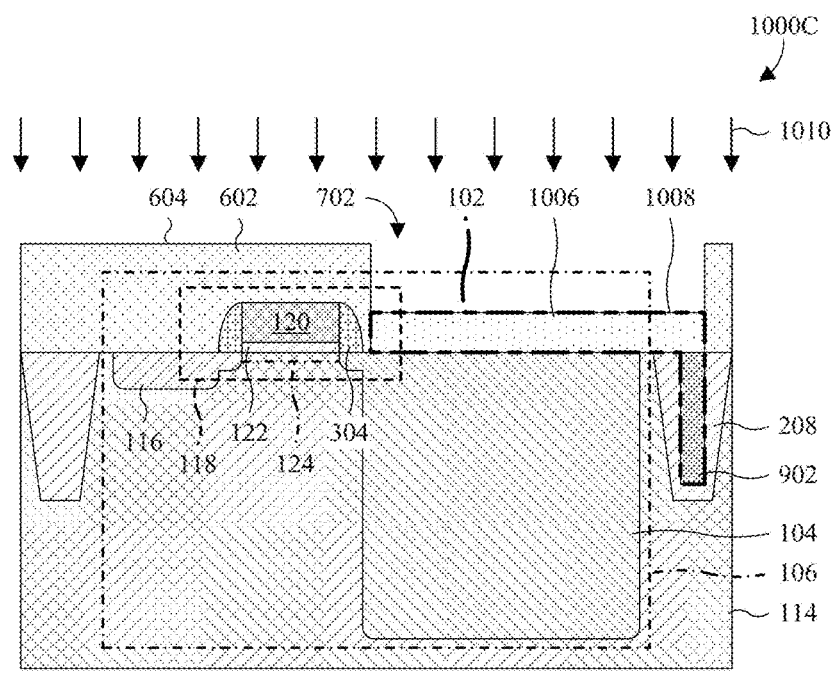

As illustrated by the cross-sectional view 1000C of FIG. 10C, a fourth etch is performed into the second reflective layer 1006 to etch back the upper or top surface 1008 of the second reflective layer 1006 to below the upper or top surface 604 of the first ILD layer 602, such that the second reflective layer 1006 is confined to the first opening 702. After performing the fourth etch, regions of the first and second reflective layers 902, 1006 in the first opening 702 and the second opening 802 (see, e.g., FIG. 8) collectively define the reflector 102. In some embodiments, the process for performing the fourth etch comprises applying a fourth etchant 1010 to the second reflective layer 1006 until the second reflective layer 1006 is etched back to the first opening 702.

Figure 10D:
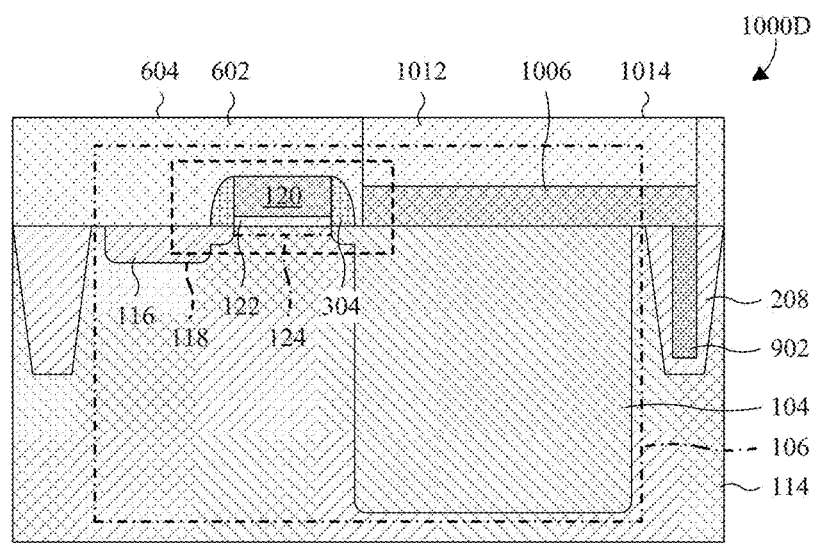

As illustrated by the cross-sectional view 1000D of FIG. 10D, a second ILD layer 1012 formed filling the first opening 702 (see, e.g., FIG. 10C) with an upper or top surface 1014 that is even with the upper or top surface 604 of the first ILD layer 602. In some embodiments, the second ILD layer 1012 is formed with the upper or top surface 1014 thereof coplanar with the upper or top surface 604 of the first ILD layer 602. Further, in some embodiments, the second ILD layer 1012 is formed of, for example, silicon dioxide, PSG, or a low κ dielectric. Even more, in some embodiments, the process for forming the second ILD layer 1012 comprises depositing or otherwise growing the second ILD layer 1012 filling the first opening 702 and covering the first ILD layer 602. Thereafter, a planarization is performed into the upper or top surface 1014 of the second ILD layer 1012 and/or the second ILD layer 1012 is etched back.

Figure 11A:
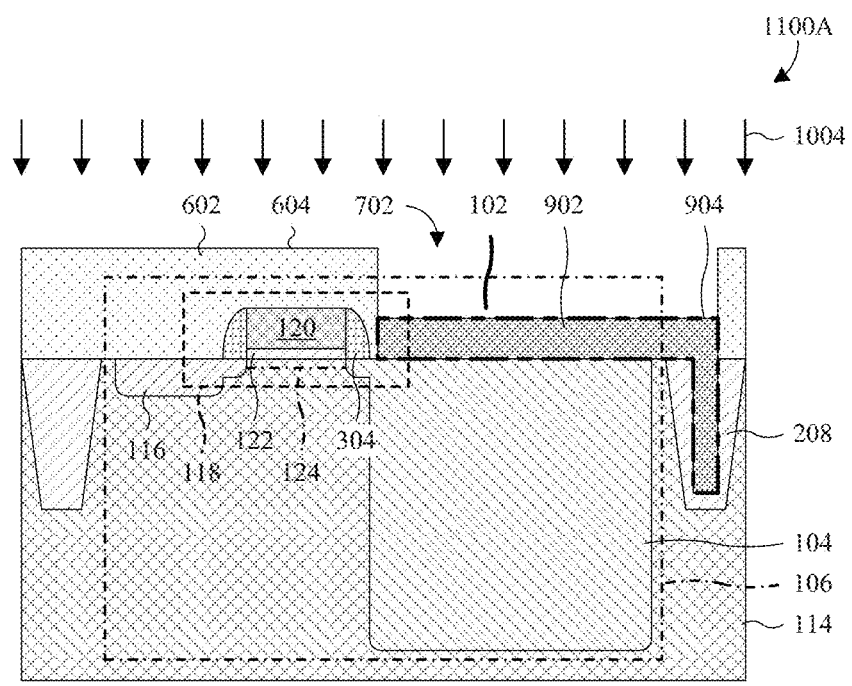
Figure 11B:
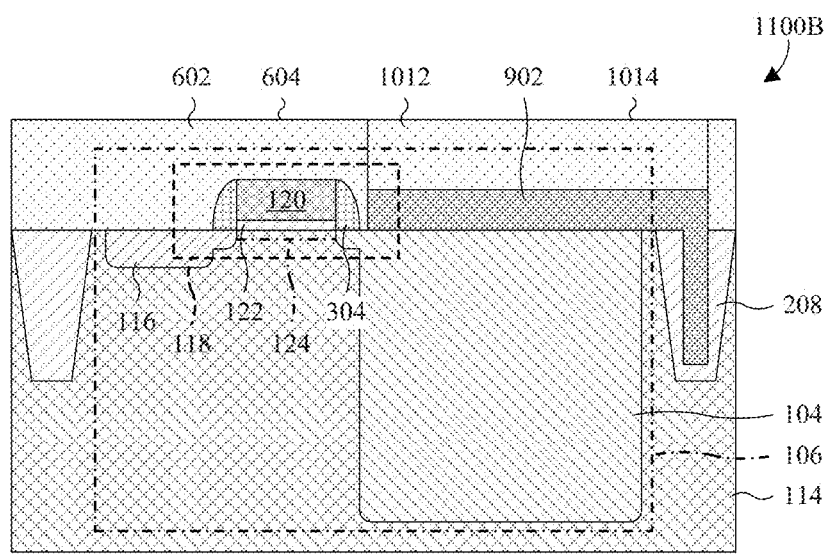

With reference to FIGS. 7-9, 11A, and 11B, a series of cross-sectional views 700-900, 1100A, 1100B of second embodiments of the method for manufacturing the reflector 102 (see, e.g., FIG. 11A) is provided. The acts of FIGS. 11A and 11B are performed in place of the acts of FIGS. 10A-10D, and after the acts of FIGS. 7-9. The second embodiments may, for example, correspond to FIG. 2B.

As illustrated by the cross-sectional view 1100A of FIG. 11A, a third etch is performed into the first reflective layer 902 to etch back the upper or top surface 904 of the first reflective layer 902 to below the upper or top surface 604 of the first ILD layer 602, such that the first reflective layer 902 is confined to the first opening 702 and the second opening 802 (see, e.g., FIG. 8). After performing the third etch, a region of the first reflective layer 902 in the first opening 702 and the second opening 802 (see, e.g., FIG. 8) defines the reflector 102. In some embodiments, the process for performing the third etch comprises applying a third etchant 1004 to the first reflective layer 902 until the upper or top surface 904 of the first reflective layer 902 is sufficiently etched back.

As illustrated by the cross-sectional view 1100B of FIG. 11B, a second ILD layer 1012 is formed filling the first opening 702 (see, e.g., FIG. 11A) with an upper or top surface 1014 that is even with the upper or top surface 604 of the first ILD layer 602. Further, in some embodiments, the process for forming the second ILD layer 1012 comprises depositing or otherwise growing the second ILD layer 1012, and subsequently performing a planarization and/or an etch back into the upper or top surface 1014 of the second ILD layer 1012.

With reference to FIGS. 12-16 and 17A-17D, a series of cross-sectional views 1200-1600, 1700A-1700D of third embodiments of the method for manufacturing the reflector 102 (see, e.g., FIG. 17C) is provided. The acts of FIGS. 12-16 and 17A-17D are performed in place of the acts of the first and second embodiments of the method, and after the acts of FIG. 6. The third embodiments may, for example, correspond to FIG. 2C.

Figure 12:
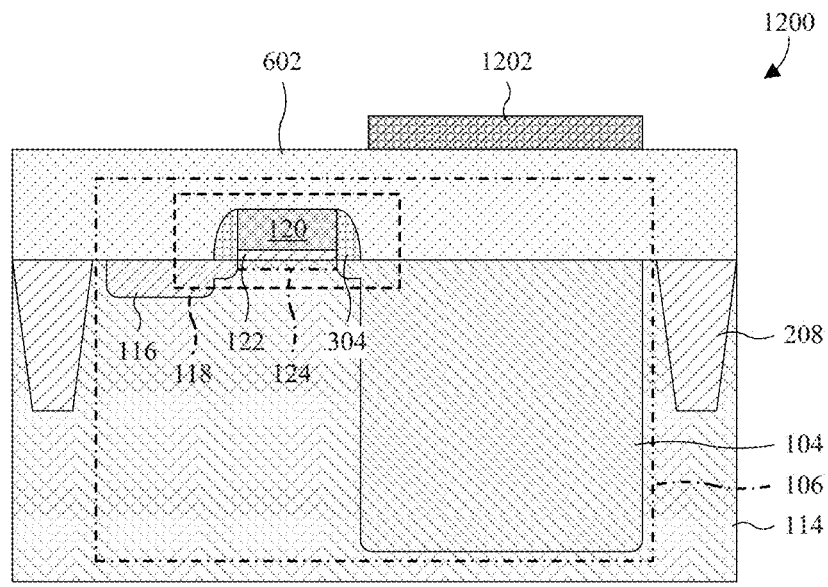

As illustrated by the cross-sectional view 1200 of FIG. 12, a third photoresist layer 1202 is formed over the first ILD layer 602, extending laterally between opposing sides of the photodetector 104. In some embodiments, the process for forming the third photoresist layer 1202 comprises depositing the third photoresist layer 1202 over the first ILD layer 602 and subsequently patterning the third photoresist layer 1202 using a first photomask.

Figure 13:
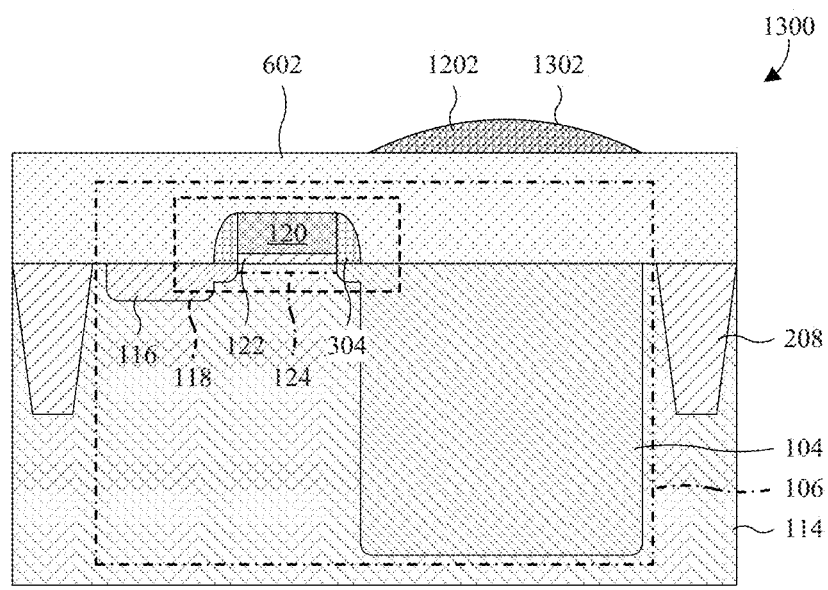

As illustrated by the cross-sectional view 1300 of FIG. 13, a first reflow or etch process is performed on the third photoresist layer 1202 to curve an upper or top surface 1302 of the third photoresist layer 1202, such that the upper or top surface 1302 is convex. In some embodiments, the first reflow or etch process is a reflow process that comprises heating the third photoresist layer 1202 until such time as the third photoresist layer 1202 begins melting and the upper or top surface 1302 of the third photoresist layer 1202 curves. For example, the reflow process may be performed by heating the third photoresist layer 1202 with an ambient temperature of about 100-130 degrees Celsius.

Figure 14:
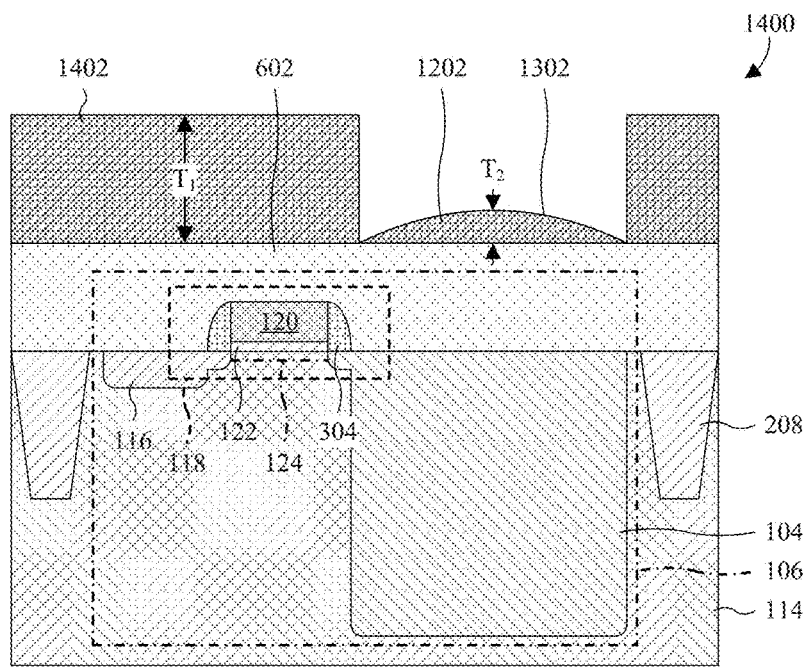

As illustrated by the cross-sectional view 1400 of FIG. 14, a fourth photoresist layer 1402 is formed over the first ILD layer 602, opposing sides of the third photoresist layer 1202. In some embodiments, the fourth photoresist layer 1402 is formed with a thickness $T_1$ greater than a maximum thickness $T_2$ of the third photoresist layer 1202, and/or is formed laterally adjoining the third photoresist layer 1202. Further, in some embodiments, the process for forming the fourth photoresist layer 1402 comprises depositing the fourth photoresist layer 1402 over the first ILD layer 602 and the third photoresist layer 1202, and subsequently patterning the fourth photoresist layer 1402 using a second photomask. Even more, in some embodiments, the fourth photoresist layer 1402 is formed of an opposite resist type as the third photoresist layer 1202, such that the first and second photomasks may be the same. For example, the third photoresist layer 1202 may be a positive resist and the fourth photoresist layer 1402 may be a negative resist, or vice versa.

Figure 15:
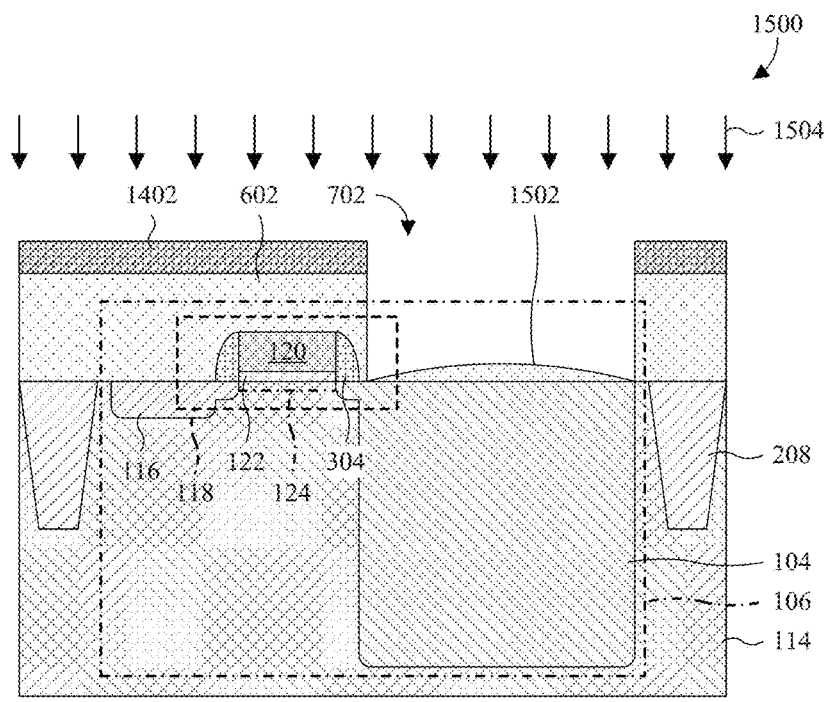

As illustrated by the cross-sectional view 1500 of FIG. 15, a fifth etch is performed into the first ILD layer 602 to form a first opening 702 overlying the photodetector 104 and having a lower or bottom surface 1502 that is convex. Further, the first opening 702 is formed to define a reflector region within which the reflector 102 (see, e.g., FIG. 17C) is formed and, in some embodiments, is formed between the transfer transistor 124 and the isolation region 208. Even more, in some embodiments, the process for performing the fifth etch comprises applying a fifth etchant 1504 to the first ILD layer 602 and the third and fourth photoresist layers 1202, 1402 (see, e.g., FIG. 14) to form the first opening 702. The fifth etchant 1504 may be, for example, equally preferential of the first ILD layer 602 and the third and fourth photoresist layers 1202, 1402, such that the third and fourth photoresist layers 1202, 1402 are eroded. After forming the first opening 702, the third and/or fourth photoresist layers 1202, 1402 are removed.

Figure 16:
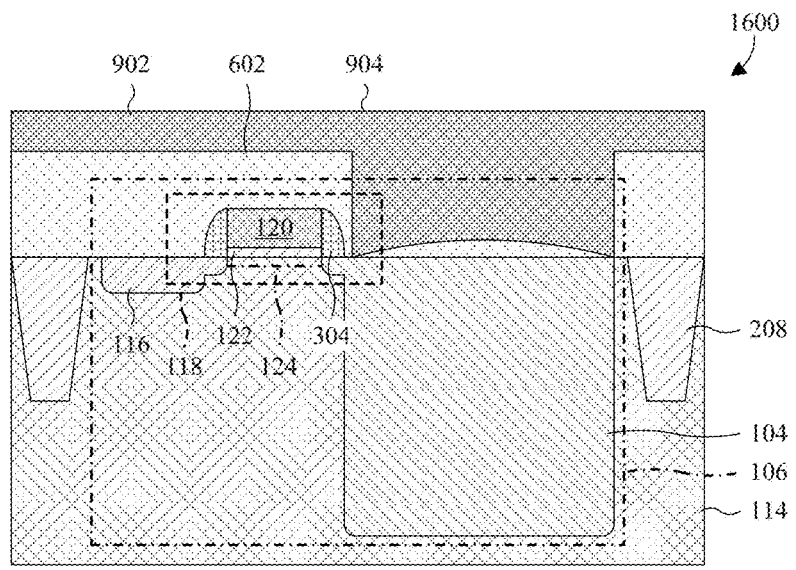

As illustrated by the cross-sectional view 1600 of FIG. 16, a first reflective layer 902 is formed covering the first ILD layer 602 and filling the first opening 702 (see, e.g., FIG. 15). Further, in some embodiments, the first reflective layer 902 is formed with an upper or top surface 904 that is planar. Even more, in some embodiments, the process for forming the first reflective layer 902 comprises depositing or otherwise growing the first reflective layer 902, and subsequently performing a planarization into the first reflective layer 902.

Figure 17A:
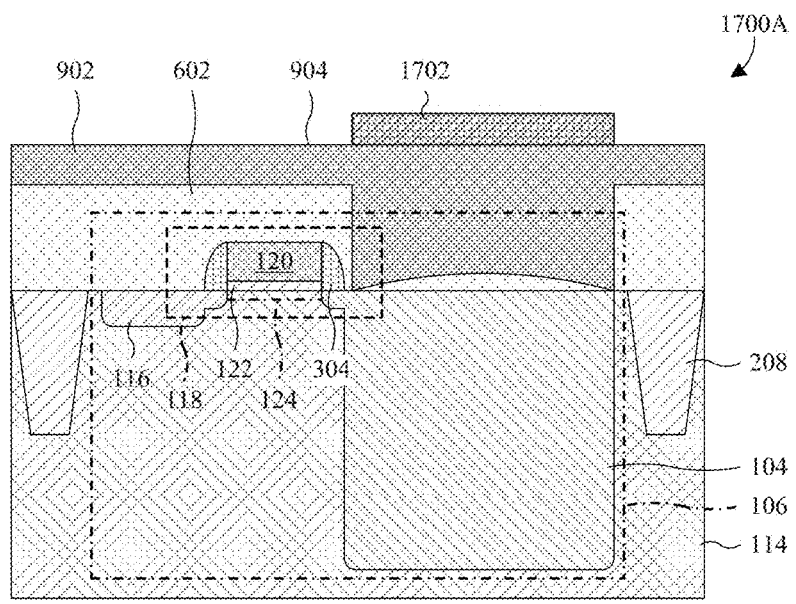

As illustrated by the cross-sectional view 1700A of FIG. 17A, a fifth photoresist layer 1702 is formed over the first reflective layer 902, extending laterally between opposing sides of the photodetector 104. In some embodiments, the process for forming the fifth photoresist layer 1702 comprises depositing the fifth photoresist layer 1702 over the first reflective layer 902 and subsequently patterning the fifth photoresist layer 1702 using a third photomask. The third photomask may be, for example, the same as the first photomask.

Figure 17B:
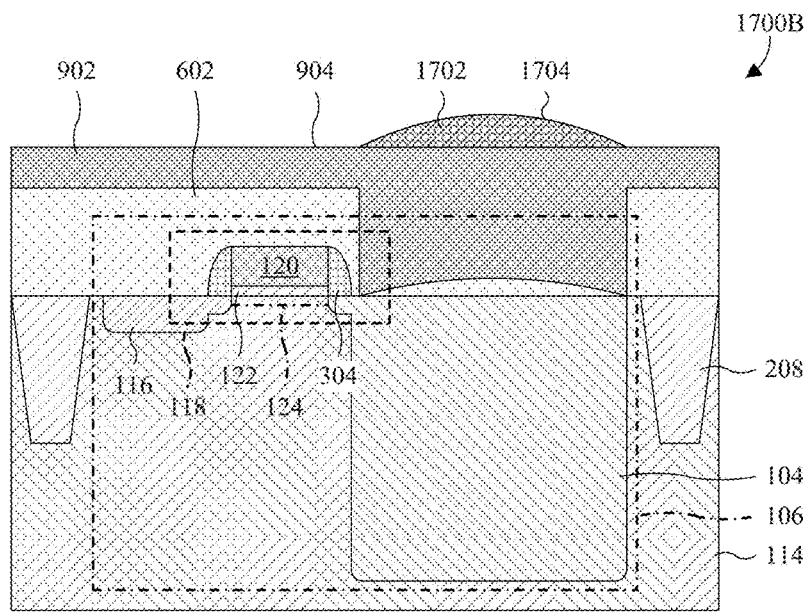

As illustrated by the cross-sectional view 1700B of FIG. 17B, a second reflow or etch process is performed on the fifth photoresist layer 1702 to curve an upper or top surface 1704 of the fifth photoresist layer 1702, such that the upper or top surface 1704 is convex. In some embodiments, the second reflow or etch process is a reflow process that comprises heating the fifth photoresist layer 1702 until such time as the fifth photoresist layer 1702 begins melting and the upper or top surface 1704 of the fifth photoresist layer 1702 curves.

Figure 17C:
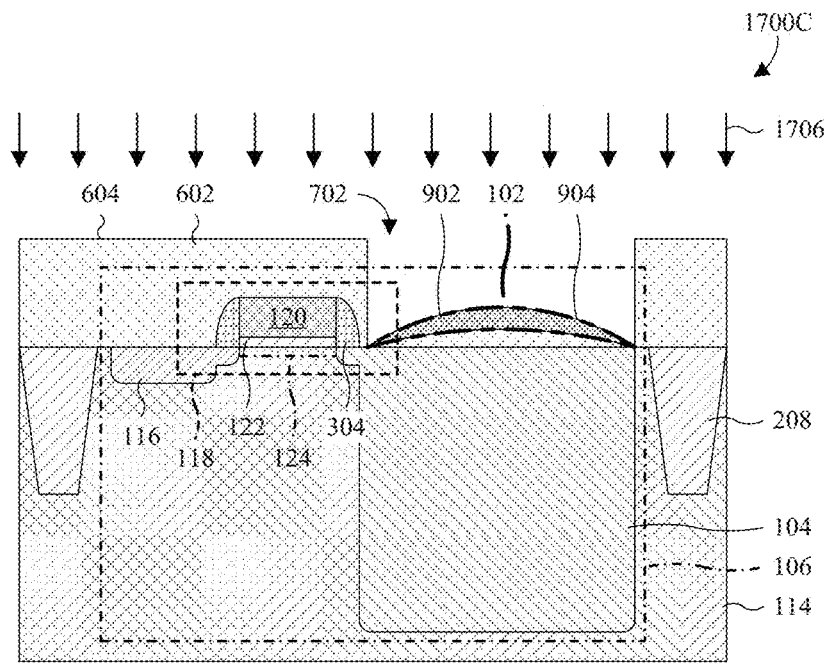

As illustrated by the cross-sectional view 1700C of FIG. 17C, a sixth etch is performed into the first reflective layer 902 to etch back the upper or top surface 904 of the first reflective layer 902 to below the upper or top surface 604 of the first ILD layer 602, such that the first reflective layer 902 is confined to the first opening 702. Further, the sixth etch curves the upper or top surface 904 of the first reflective layer 902, such that the upper or top surface 904 is convex. After performing the sixth etch, a region of the first reflective layer 902 in the first opening 702 defines the reflector 102. In some embodiments, the process for performing the sixth etch comprises applying a sixth etchant 1706 to the first reflective layer 902 and the fifth photoresist layer 1702 until the first reflective layer 902 is sufficiently etched back. The sixth etchant 1706 may be, for example, equally preferential of the fifth photoresist layer 1702 and the first reflective layer 902, such that the fifth photoresist layer 1702 is eroded and removed while applying the sixth etchant 1706.

Figure 17D:
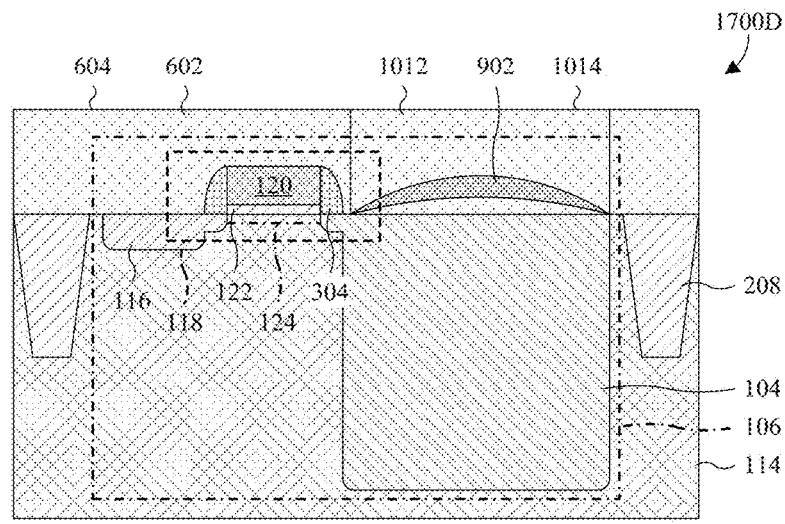

As illustrated by the cross-sectional view 1700D of FIG. 17D, a second ILD layer 1012 is formed filling the first opening 702 (see, e.g., FIG. 17C) with an upper or top surface 1014 that is even with the upper or top surface 604 of the first ILD layer 602. In some embodiments, the process for forming the second ILD layer 1012 comprises depositing or otherwise growing the second ILD layer 1012, and subsequently performing a planarization into the second ILD layer 1012.

Figure 18A:
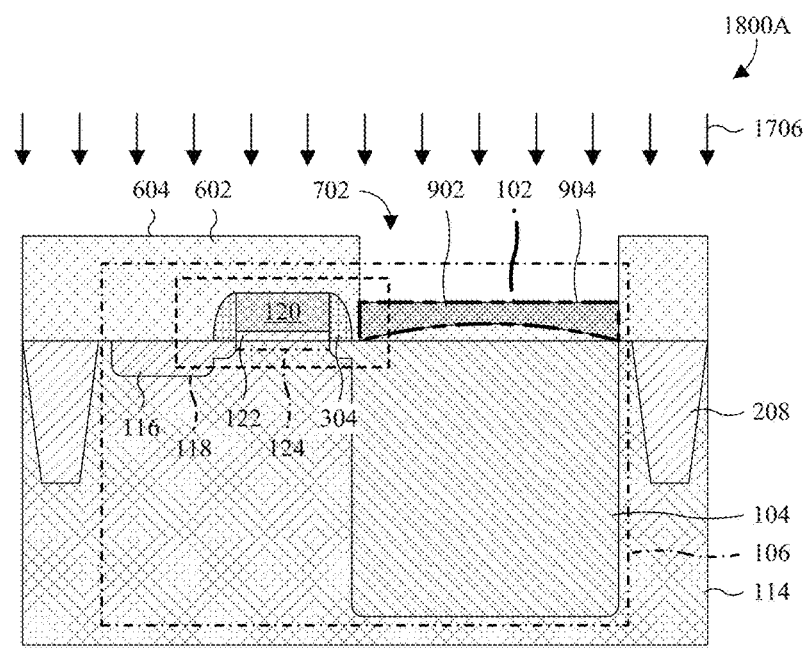
Figure 18B:
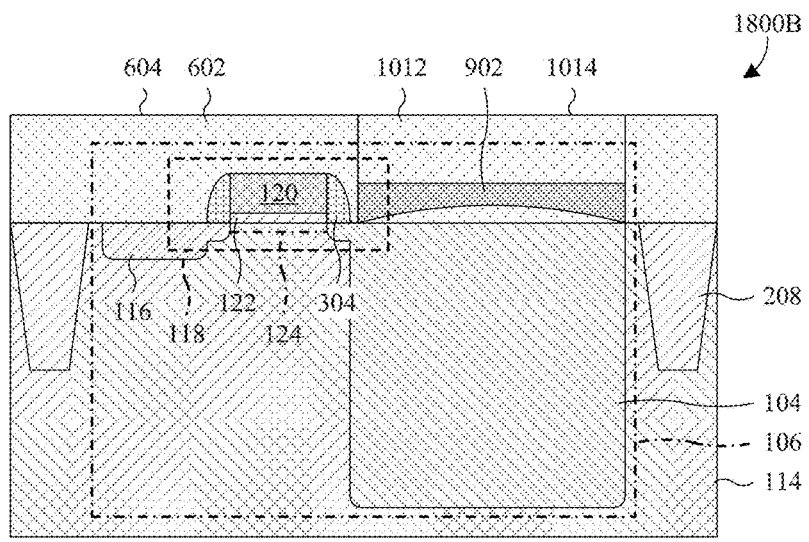

With reference to FIGS. 12-16, 18A, and 18B, a series of cross-sectional views 1200-1600, 1800A, 1800B of fourth embodiments of the method for manufacturing the reflector 102 (see, e.g., FIG. 18A) is provided. The acts of FIGS. 18A and 18B are performed in place of the acts of FIGS. 17A-D, and after the acts of FIGS. 12-16. The fourth embodiments may, for example, correspond to FIG. 2D.

As illustrated by the cross-sectional view 1800A of FIG. 18A, a sixth etch is performed into the first reflective layer 902 to etch back the upper or top surface 904 of the first reflective layer 902 to below the upper or top surface 604 of the first ILD layer 602, such that the first reflective layer 902 is confined to the first opening 702. After performing the sixth etch, a region of the first reflective layer 902 in the first opening 702 defines the reflector 102. In some embodiments, the process for performing the sixth etch comprises applying a sixth etchant 1706 to the first reflective layer 902 until the first reflective layer 902 is sufficiently etched back.

As illustrated by the cross-sectional view 1800B of FIG. 18B, a second ILD layer 1012 is formed filling the first opening 702 (see, e.g., FIG. 18A) with an upper or top surface 1014 that is even with the upper or top surface 604 of the first ILD layer 602. In some embodiments, the process for forming the second ILD layer 1012 comprises depositing or otherwise growing the second ILD layer 1012, and subsequently performing a planarization into the second ILD layer 1012.

With reference to FIGS. 19-23, a series of cross-sectional views 1900-2300 of fifth embodiments of the method for manufacturing the reflector 102 (see, e.g., FIG. 22) is provided. The acts of FIGS. 19-23 are performed in place of the acts of the first, second, third, and fourth embodiments of the method, and after the acts of FIG. 6. The fifth embodiments may, for example, correspond to FIG. 2D.

Figure 19:
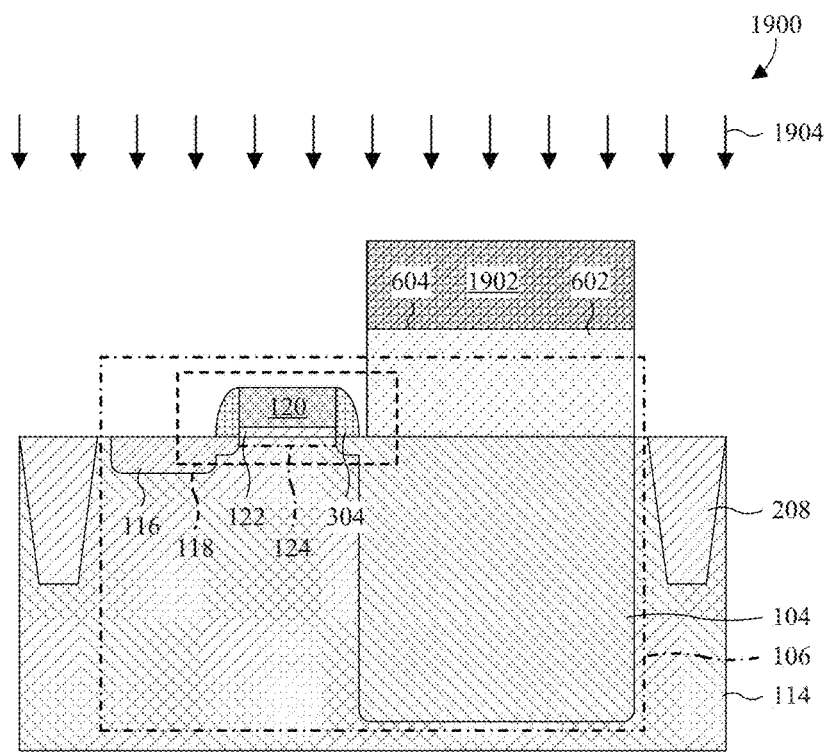
Figure 20:
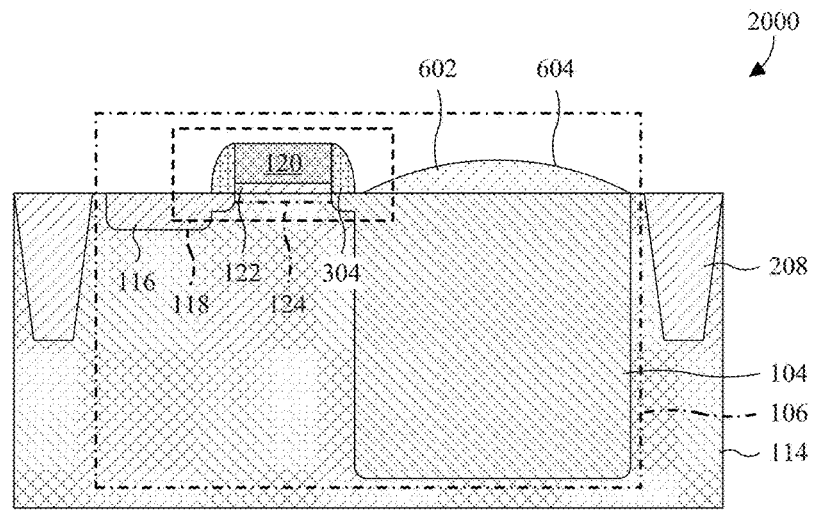

As illustrated by the cross-sectional view 1900 of FIG. 19, a seventh etch is performed into the first ILD layer 602 to remove regions of the first ILD layer 602 that laterally surround the photodetector 104. Further, the seventh etch is performed to define a reflector region within which the reflector 102 (see, e.g., FIG. 22) is formed and, in some embodiments, to restrict the first ILD layer 602 to between the transfer transistor 124 and the isolation region 208. Even more, in some embodiments, the process for performing the seventh etch comprises depositing and patterning a sixth photoresist layer 1902 over the first ILD layer 602 using a fourth photomask. Thereafter, a seventh etchant 1904 is applied to the first ILD layer 602, while using the sixth photoresist layer 1902 as a mask, to remove the surrounding regions of the first ILD layer 602. After removing the surrounding regions, the sixth photoresist layer 1902 is removed.

As illustrated by the cross-sectional view 2000 of FIG. 2000, a third reflow or etch process is performed on the first ILD layer 602 to curve an upper or top surface 604 of the first ILD layer 602, such that the upper or top surface 604 is convex. In some embodiments, the third reflow or etch process is a reflow process that comprises heating the first ILD layer 602 until such time as the first ILD layer 602 begins melting and the upper or top surface 604 of the first ILD layer 602 curves.

Figure 21:
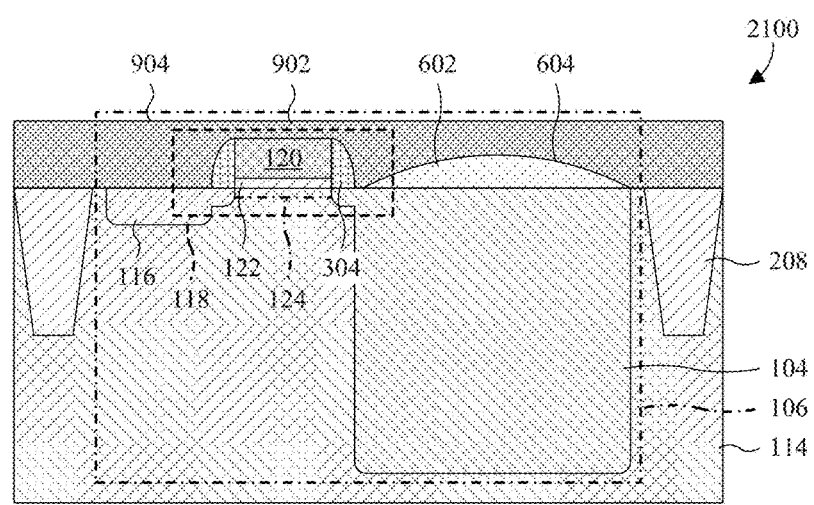

As illustrated by the cross-sectional view 2100 of FIG. 21, a first reflective layer 902 is formed covering the first ILD layer 602, the pixel sensor 106, and the semiconductor substrate 114. Further, in some embodiments, the first reflective layer 902 is formed with an upper or top surface 904 that is planar. Even more, in some embodiments, the process for forming the first reflective layer 902 comprises depositing or otherwise growing the first reflective layer 902, and subsequently performing a planarization into the first reflective layer 902.

Figure 22:
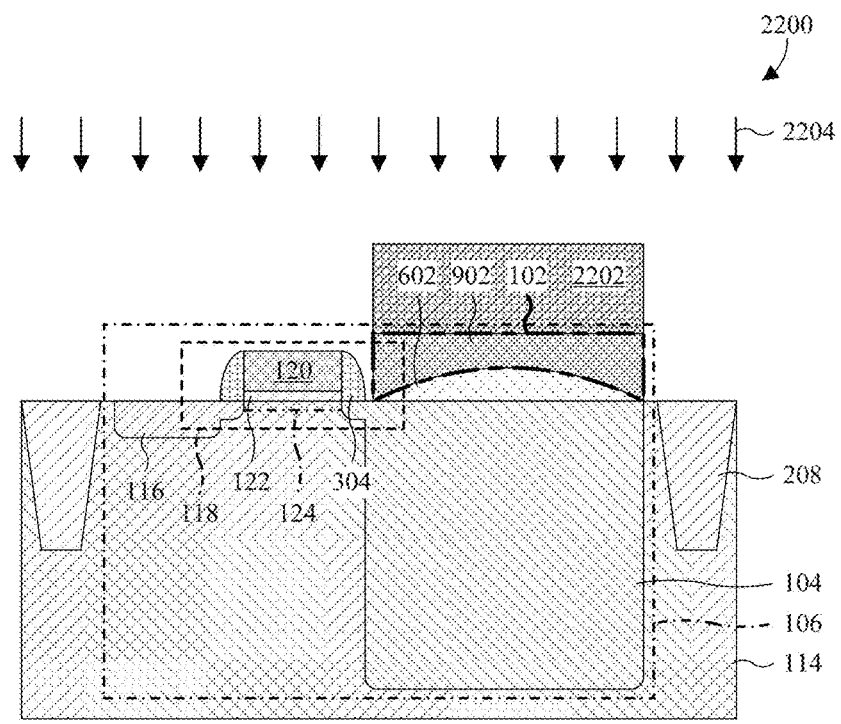

As illustrated by the cross-sectional view 2200 of FIG. 22, an eighth etch is performed into the first reflective layer 902 to remove regions of the first reflective layer 902 that laterally surround the photodetector 104 and/or the first ILD layer 602. In some embodiments, the eighth etch is further performed to restrict the first reflective layer 902 to directly over the first ILD layer 602. After performing the eighth etch, a region of the first reflective layer 902 arranged over the photodetector 104 defines the reflector 102. In some embodiments, the process for performing eighth seventh etch comprises depositing and patterning a seventh photoresist layer 2202 over the first reflective layer 902 using a fifth photomask. The fifth photomask may, for example, be the same as the fourth photomask. Thereafter, an eighth etchant 2204 is applied to the first reflective layer 902, while using the seventh photoresist layer 2202 as a mask, to remove the surrounding regions of the first reflective layer 902. After removing the surrounding regions, the seventh photoresist layer 2202 is removed.

Figure 23:
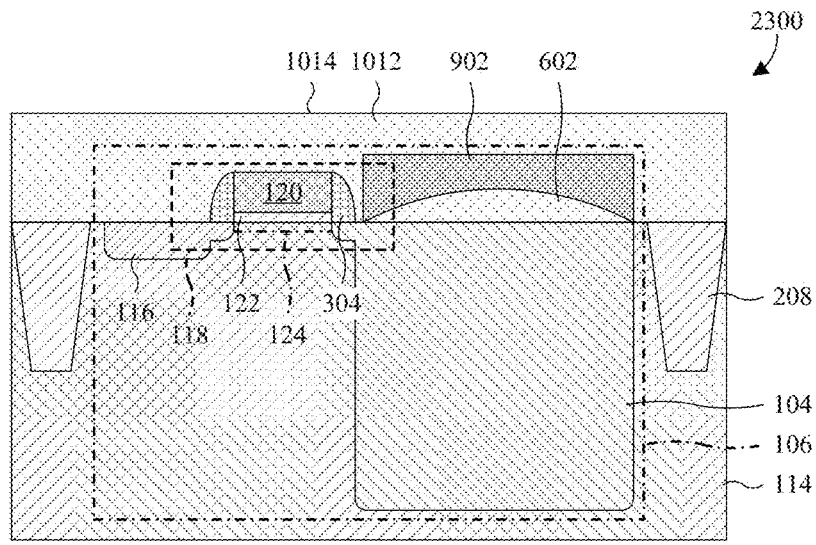

As illustrated by the cross-sectional view 2300 of FIG. 23, a second ILD layer 1012 is formed covering the first reflective layer 902, the pixel sensor 106, and the semiconductor substrate 114. Further, in some embodiments, the second ILD layer 1012 is formed with an upper or top surface 1014 that is planar. Even more, in some embodiments, the process for forming the second ILD layer 1012 comprises depositing or otherwise growing the second ILD layer 1012, and subsequently performing a planarization into the upper or top surface 1014 of the second ILD layer 1012.

With reference to FIGS. 24-27, a series of cross-sectional views 2400-2700 illustrate post processing performed after forming the reflector 102 (see, e.g., FIG. 10C, 11A, 17C, 18A, or 22) according to one of the foregoing embodiments. Although illustrated with respect to the semiconductor structure of FIG. 10D, it is to be appreciated that the post processing may also be performed on the semiconductor structure of FIG. 11B, 17D, 18B, or 23.

Figure 24:
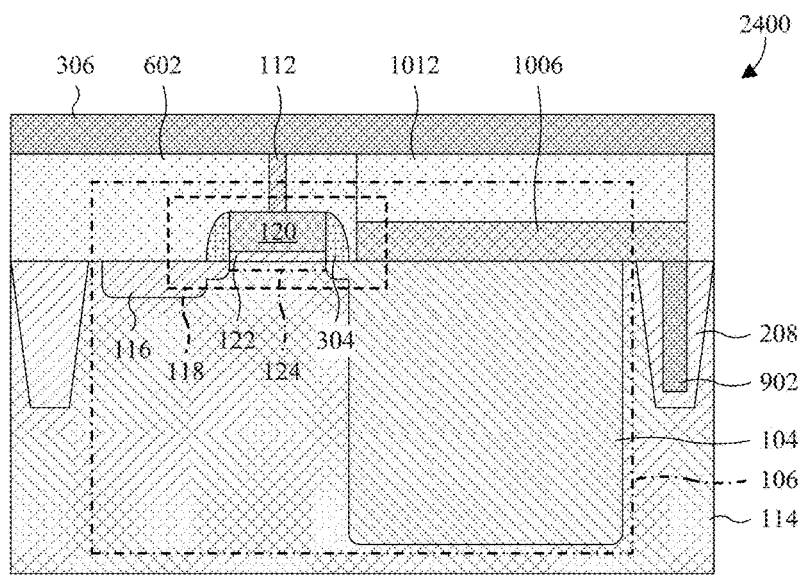

As illustrated by the cross-sectional view 2400 of FIG. 24, an interconnect layer 306 is formed over the first and second ILD layers 602, 1012 and electrically coupled to the gate 120 by a contact via 112 extending from the interconnect layer 306, through the first and/or second ILD layers 602, 1012, to the pixel sensor 106. In some embodiments, the contact via 112 extends to the gate 120 of the transfer transistor 118, and/or the contact via 112 and the interconnect layer 306 are formed of a conductive material, such as, for example, copper, aluminum, tungsten, gold, or some other conductive material. Further, in some embodiments, the contact via 112 and the interconnect layer 306 are formed according to a dual-damascene-like process or a single-damascene-like process. A dual-damascene-like process and a single-damascene-like process are respectively a dual-damascene process and a single-damascene process that aren't restricted to copper, such that other materials may be used in place of copper.

Figure 25:
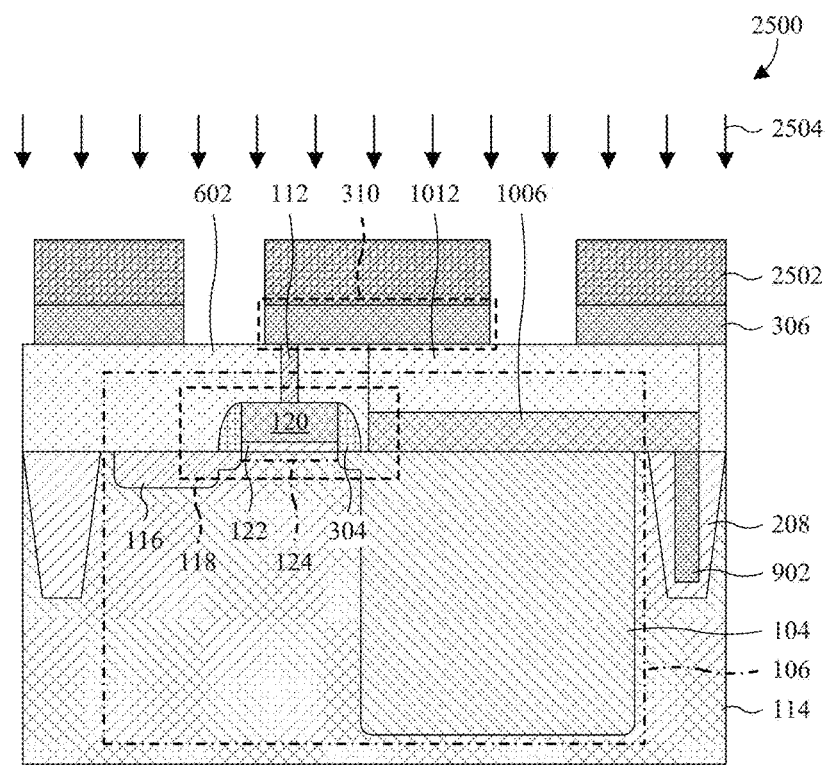

As illustrated by the cross-sectional view 2500 of FIG. 25, a ninth etch is performed into the interconnect layer 306 to form conductive features 310 over the first and second ILD layers 602, 1012. In some embodiments, the process for performing the ninth etch comprises depositing and patterning an eighth photoresist layer 2502 over the interconnect layer 306, such that the eighth photoresist layer 2502 masks regions of the interconnect layer 306 corresponding to the conductive features 310. Thereafter, a ninth etchant 2504 is applied to the interconnect layer 306, while using the eighth photoresist layer 2502 as a mask, to form the conductive features 310. Thereafter, the eighth photoresist layer 2502 is removed.

Figure 26:
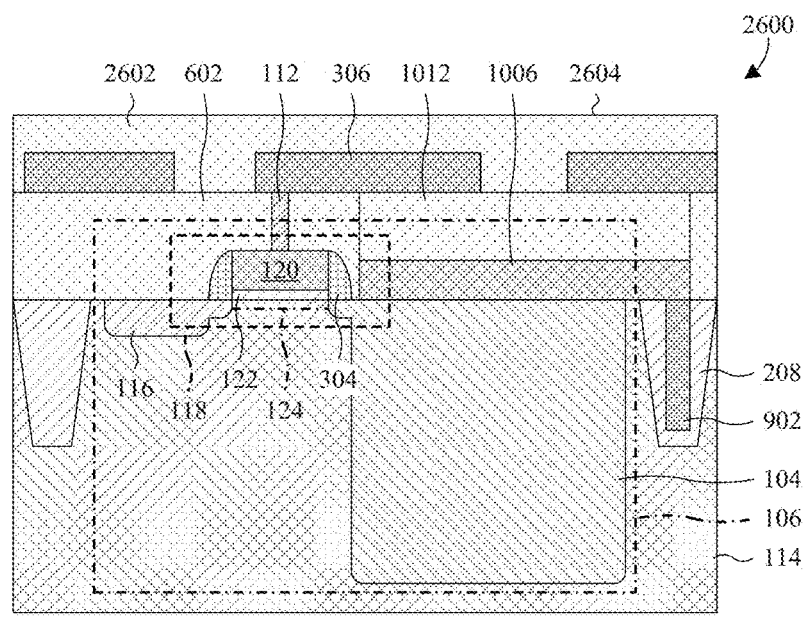

As illustrated by the cross-sectional view 2600 of FIG. 26, a third ILD layer 2602 is formed covering the interconnect layer 306 and the first and second ILD layers 602, 1012. Further, in some embodiments, the third ILD layer 2602 is formed with an upper or top surface 2604 that is planar, and/or is formed of silicon dioxide, PSG, a low κ dielectric, or some other dielectric material. Even more, in some embodiments, the process for forming the third ILD layer 2602 comprises depositing or otherwise growing the third ILD layer 2602, and subsequently performing a planarization into the third ILD layer 2602.

While not illustrated, the Acts of FIGS. 24-26 may be repeated for additional interconnect layers. For example, an additional interconnect layer may be formed over the third ILD layer 2602 and electrically coupled to the interconnect layer 306 by an interconnect via extending from the additional interconnect layer, through the third ILD layer 2602, to the interconnect layer. A tenth etch may then be performed into the additional interconnect layer to form additional conductive features over the third ILD layer 2602, and a fourth ILD layer may be formed covering the additional interconnect layer.

Figure 27:
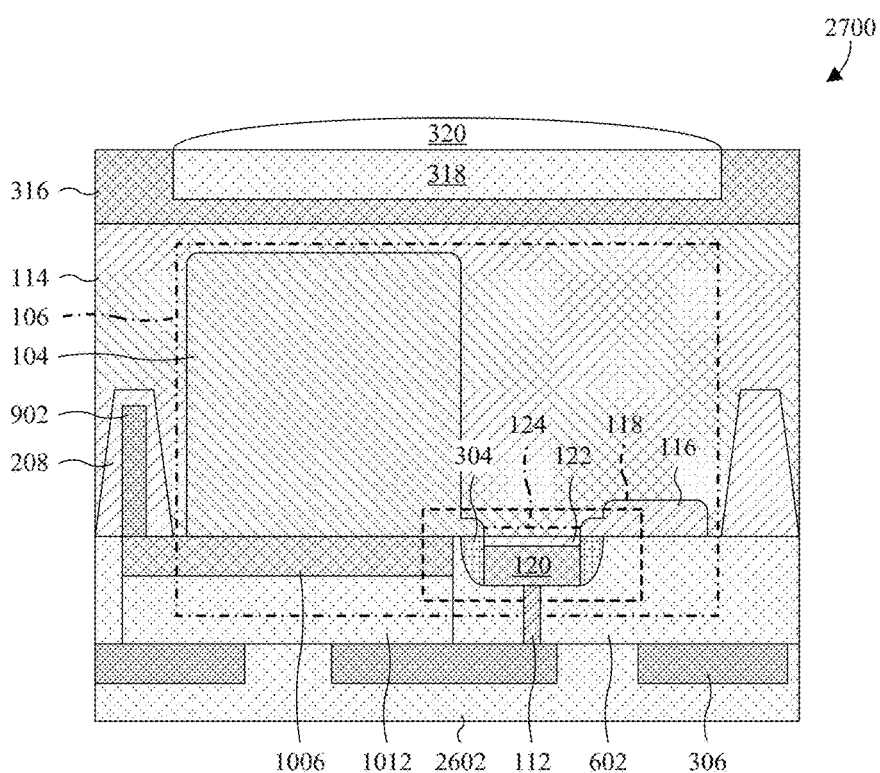

As illustrated by the cross-sectional view 2700 of FIG. 27, the semiconductor structure of FIG. 26 is rotated about 180 degrees and a passivation layer 316 is formed on the semiconductor substrate 114. In some embodiments, the passivation layer 316 is formed of silicon nitride or silicon dioxide. Further, in some embodiments, the process for forming the passivation layer 316 comprises depositing or otherwise growing the passivation layer 316 by, for example, thermal oxidation or vapor deposition. Also illustrated by the cross-sectional view 2700 of FIG. 27, a color filter 318 is formed buried in the passivation layer 316, and a microlens 320 is formed covering the color filter 318.

Figure 28:
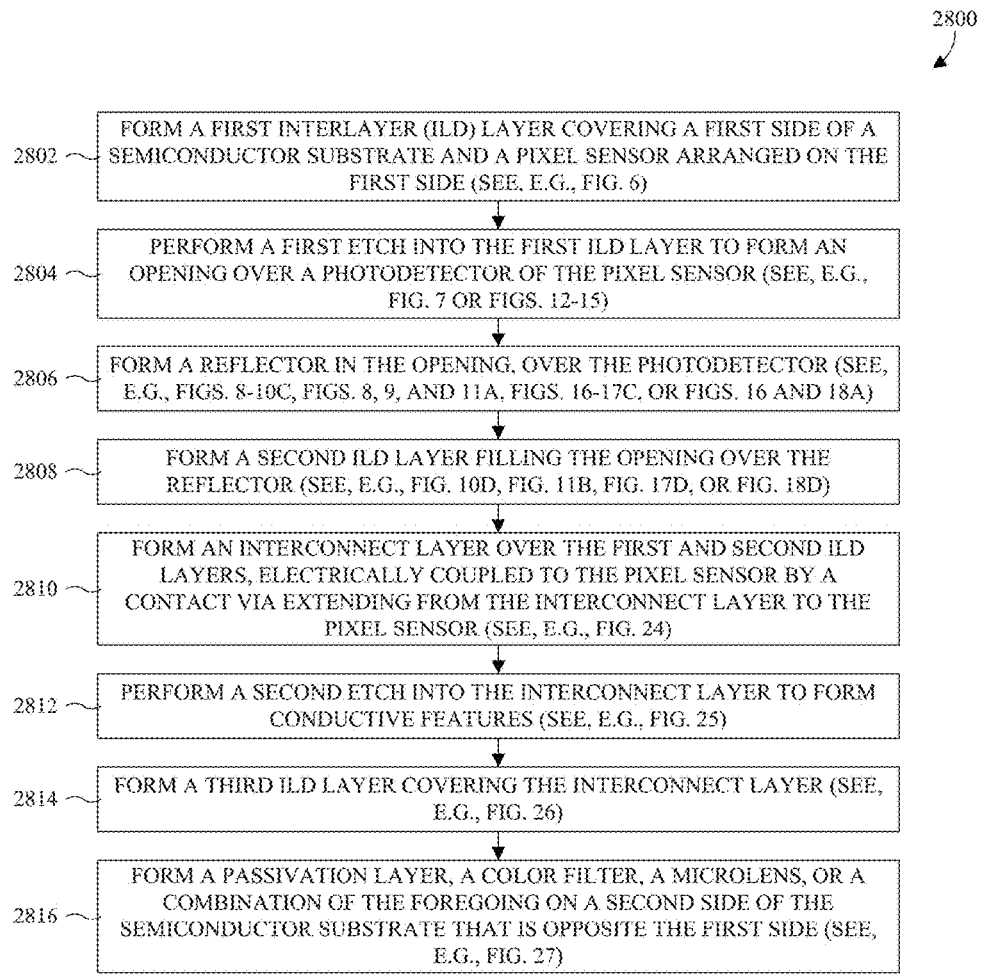
FIGS. 28 and 29 illustrate cross-sectional views of various embodiments of a method for manufacturing a BSI image sensor with a reflector.

With reference to FIG. 28, a flowchart 2800 of some embodiments of a method for manufacturing a BSI image sensor with a reflector is provided.

At 2802, a first ILD layer is formed covering a first side of a semiconductor substrate and a pixel sensor arranged on the first side. See, for example, FIG. 6.

At 2804, a first etch is performed into the first ILD layer to form an opening over a photodetector of the pixel sensor. See, for example, FIG. 7 or FIGS. 12-15.

At 2806, a reflector is formed in the opening, over the photodetector. See, for example, FIGS. 8-10C, FIGS. 8, 9, and 11A, FIGS. 16-17C, or FIGS. 16 and 18A.

At 2808, a second ILD layer is formed filling the opening over the reflector. See, for example, FIG. 10D, FIG. 11B, FIG. 17D, or FIG. 18D.

At 2810, an interconnect layer is formed over the first and second ILD layers, electrically coupled to the pixel sensor by a contact via extending from the interconnect layer to the pixel sensor. See, for example, FIG. 24.

At 2812, a second etch is performed into the interconnect layer to form conductive features. See, for example, FIG. 25.

At 2814, a third ILD layer is formed covering the interconnect layer. See, for example, FIG. 26.

At 2816, a passivation layer, a color filter, a microlens, or a combination of the foregoing are formed on a second side of the semiconductor substrate that is opposite the first side. See, for example, FIG. 27.

Figure 29:
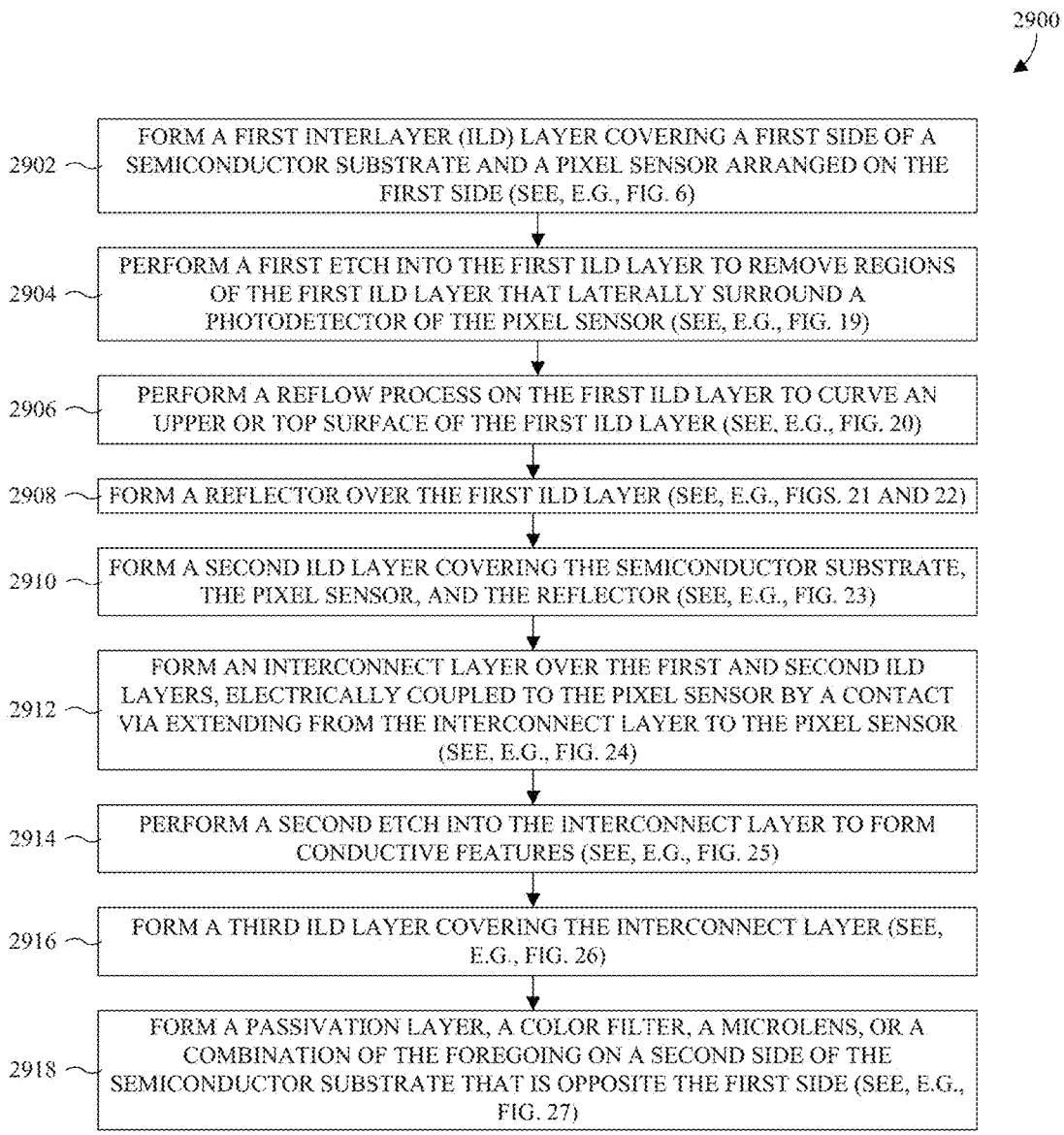

With reference to FIG. 29, a flowchart 2900 of other embodiments of the method for manufacturing the BSI image sensor with the reflector is provided.

At 2902, a first ILD layer is formed covering a first side of a semiconductor substrate and a pixel sensor arranged on the first side. See, for example, FIG. 6.

At 2904, a first etch is performed into the first ILD layer to remove regions of the first ILD layer that laterally surround a photodetector of the pixel sensor. See, for example, FIG. 19.

At 2906, a reflow process is performed on the first ILD layer to curve an upper or top surface of the first ILD layer. See, for example, FIG. 20.

At 2908, a reflector is formed over the first ILD layer. See, for example, FIGS. 21 and 22.

At 2910, a second ILD layer is formed covering the semiconductor substrate, the pixel sensor, and the reflector. See, for example, FIG. 23.

At 2912, an interconnect layer is formed over the first and second ILD layers, electrically coupled to the pixel sensor by a contact via extending from the interconnect layer to the pixel sensor. See, for example, FIG. 24.

At 2914, a second etch is performed into the interconnect layer to form conductive features. See, for example, FIG. 25.

At 2916, a third ILD layer is formed covering the interconnect layer. See, for example, FIG. 26.

At 2918, a passivation layer, a color filter, a microlens, or a combination of the foregoing are formed on a second side of the semiconductor substrate that is opposite the first side. See, for example, FIG. 27.

While the method described by the flowcharts 2800, 2900 of FIGS. 28 and 29 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, as can be appreciated from above, the present disclosure provides an image sensor. A pixel sensor is arranged on a lower side of a semiconductor substrate, and comprises a photodetector arranged within the semiconductor substrate. An interconnect structure is arranged under the semiconductor substrate and the pixel sensor, and comprises an interconnect layer and a contact via extending from the interconnect layer to the pixel sensor. A reflector is arranged under the photodetector, between the interconnect layer and the photodetector, and is configured to reflect incident radiation towards the photodetector.

In other embodiments, the present disclosure provides a method for manufacturing an image sensor. A first ILD layer is formed covering a semiconductor substrate and a pixel sensor arranged on the semiconductor substrate. An etch is performed into the first ILD layer to form a reflector region overlying a photodetector of the pixel sensor that is arranged in the semiconductor substrate. A reflector is formed overlying the photodetector, in the reflector region. A second ILD layer is formed covering the reflector. An interconnect layer is formed over the first and second ILD layers, and electrically coupled to a contact via extending from the interconnect layer to the pixel sensor.

In yet other embodiments, the present disclosure provides an image sensor is provided. An interconnect structure is arranged under a semiconductor substrate and comprises layers of conductive features stacked within an ILD region. A photodetector is arranged within the semiconductor substrate. A reflector is arranged under the photodetector, between the interconnect structure and the photodetector. The reflector is configured to reflect incident radiation towards the photodetector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
   a pixel sensor arranged on a lower side of a semiconductor substrate, wherein the pixel sensor comprises a photodetector arranged within the semiconductor substrate;
   an interconnect structure arranged under the semiconductor substrate and the pixel sensor, wherein the interconnect structure comprises an interconnect layer and a contact via extending from the interconnect layer to the pixel sensor;
   a reflector arranged under the photodetector, between the interconnect layer and the photodetector, and configured to reflect incident radiation towards the photodetector; and
   an isolation region extending into the lower side of the semiconductor substrate, and arranged laterally adjacent to the photodetector, wherein the reflector comprises a first segment extending laterally under the photodetector, and wherein the reflector further comprises a second segment extending into the isolation region from the first segment.

2. The image sensor according to claim 1, wherein the reflector is continuous between the first and second segments.

3. The image sensor according to claim 1, wherein the first segment has an upper surface facing the photodetector, and wherein the second segment extends into the isolation region in a direction orthogonal to the upper surface of the first segment.

4. The image sensor according to claim 1, wherein a lower surface of the second segment contacts an upper surface of the first segment.

5. The image sensor according to claim 1, further comprising:
   a transfer transistor arranged laterally adjacent to the pixel sensor, wherein the contact via extends to a gate of the transfer transistor.

6. An image sensor comprising:
   an interconnect structure arranged under a semiconductor substrate and comprising layers of conductive features stacked within an interlayer dielectric (ILD) region;
   a photodetector arranged within the semiconductor substrate; and
   a reflector arranged under the photodetector, between the interconnect structure and the photodetector, wherein the reflector is configured to reflect incident radiation towards the photodetector, and wherein the reflector has a top surface that is curved so edges of the top surface are closer to the semiconductor substrate than a center of the top surface.

7. The image sensor according to claim 6, further comprising:
   a transistor arranged under the semiconductor substrate, between the interconnect structure and the semiconductor substrate, wherein the transistor comprises a gate electrode, and wherein the reflector is between a bottom surface of the gate electrode and the photodetector.

8. The image sensor according to claim 7, further comprising:
   a dielectric layer under and contacting the semiconductor substrate, wherein the dielectric layer has a second bottom surface that is curved so edges of the second bottom surface are closer to the semiconductor substrate than a center of the second bottom surface, wherein the reflector is under and conformally contacts the second bottom surface, and wherein the reflector is conductive.

9. The image sensor according to claim 8, wherein the dielectric layer has a top surface that is planar and that contacts the semiconductor substrate, and wherein the edges of the second bottom surface respectively contact edges of the top surface of the dielectric layer.

10. The image sensor according to claim 8, wherein the reflector has a third bottom surface that is curved so edges of the third bottom surface are closer to the top surface of the reflector than a center of the third bottom surface.

11. The image sensor according to claim 8, wherein the reflector has a third bottom surface that is planar and that has edges spaced from the edges of the top surface of the reflector.

12. The image sensor according to claim 8, wherein the dielectric layer has a segment entirely spaced from a bulk of the dielectric layer by the reflector, wherein the segment is directly between the photodetector and the reflector, and wherein the segment defines the second bottom surface of the dielectric layer.

13. The image sensor according to claim 7, wherein the transistor comprises a source/drain region arranged in the semiconductor substrate, wherein a bottom surface of the photodetector and a bottom surface of the source/drain region are even with a bottom surface of the semiconductor substrate, and wherein the reflector is between the bottom surface of the semiconductor substrate and the bottom surface of the gate electrode.

14. The image sensor according to claim 13, wherein the transistor comprises a gate dielectric layer under and contacting the bottom surface of the semiconductor substrate, and wherein the gate electrode has a top surface that is under and contacts the gate dielectric layer.

15. An image sensor comprising:
   a semiconductor substrate comprising a photodetector bordering a bottom surface of the semiconductor substrate;
   a transistor on the bottom surface of the semiconductor substrate, wherein the transistor comprises a gate dielectric layer under and contacting the bottom surface of the semiconductor substrate, and further comprises a gate electrode under and contacting the gate dielectric layer;
   a reflector bordering the bottom surface of the semiconductor substrate, directly under the photodetector, wherein the reflector is conductive and configured to reflect incident radiation towards the photodetector, wherein the reflector extends laterally respectively from and to opposite sides of the photodetector, and wherein a top surface of the reflector is spaced over a bottom surface of the gate electrode; and a shallow trench isolation (STI) region extending into the bottom surface of the semiconductor substrate, wherein the photodetector is laterally between the STI region and the gate electrode, and wherein the reflector protrudes into the STI region.

16. The image sensor according to claim 15, wherein the reflector comprises a first line-shaped segment and a second line-shaped segment orthogonal to the first line-shaped segment, wherein the first line-shaped segment is directly under the photodetector, and wherein the second line-shaped segment extends into the STI region from the first line-shaped segment.

17. The image sensor according to claim 16, wherein the reflector is continuous between the first and second line-shaped segments.

18. The image sensor according to claim 16, wherein the reflector is discontinuous from the first line-shaped segment to the second line-shaped segment.

19. The image sensor according to claim 15, further comprising:

an interconnect structure under the semiconductor substrate, wherein the interconnect structure comprises a plurality of interconnect layers and a plurality via layers alternatingly stacked, and wherein the via layers comprise a contact via extending from contact with the gate electrode to contact with one of the interconnect layers.

20. The image sensor according to claim 15, further comprising:

a color filter and a microlens stacked on a top surface of the semiconductor substrate, wherein the microlens is over the color filter.

* * * * *